(12) United States Patent
Watanabe

(10) Patent No.: US 7,636,747 B2
(45) Date of Patent: Dec. 22, 2009

(54) DIGITAL LOW-PASS FILTER

(75) Inventor: Hikaru Watanabe, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 210 days.

(21) Appl. No.: 11/984,245

(22) Filed: Nov. 15, 2007

(65) Prior Publication Data

US 2008/0120356 A1 May 22, 2008

(30) Foreign Application Priority Data

Nov. 22, 2006 (JP) ............................. 2006-316184

(51) Int. Cl.
*G06F 17/10* (2006.01)
(52) U.S. Cl. ..................................... 708/320
(58) Field of Classification Search ................. 708/320
See application file for complete search history.

(56) References Cited

U.S. PATENT DOCUMENTS 5,420,892 A * 5/1995 Okamoto .................... 375/350
5,440,503 A * 8/1995 Maruyama .................. 708/313
5,712,874 A * 1/1998 Okamoto .................... 375/243
7,346,639 B2 * 3/2008 Pilgram ...................... 708/320

FOREIGN PATENT DOCUMENTS

| JP | 02-113712 | 4/1990 |
|----|-----------|--------|
| JP | 03-124110 | 5/1991 |
| JP | 2000-285360 | 10/2000 |

* cited by examiner

*Primary Examiner*—Chuong D Ngo
(74) *Attorney, Agent, or Firm*—Finnegan, Henderson, Farabow, Garrett & Dunner, LLP

(57) ABSTRACT

A digital low-pass filter includes: a first subtracter that subtracts a first feedback term from an input; a first multiplier that multiplies an first subtracter output by a constant $k_1$; a first delay unit that delays an input by a predetermined sampling time; a first adder that supplies, to the first delay unit, the input obtained by adding an first multiplier output to an first delay unit output; a second subtracter that subtracts the first feedback term from an first adder output; a second multiplier that multiplies an second subtracter output by a constant $k_2$; a second delay unit that outputs, as the first feedback term, a signal obtained by delaying an input by a predetermined sampling time; and a second adder that supplies, to the second delay unit, a signal obtained by adding an second multiplier output to the second delay unit output.

11 Claims, 17 Drawing Sheets

| (1) | Q=2 | | |
|---|---|---|---|
| (4) | Q=1 | EXPRESSION 11 (SOLID LINE) | $K_1 = \dfrac{1 - 2\exp(-\frac{\omega_0 T}{2Q}) \cdot \cos[\omega_0 T\sqrt{1 - \frac{1}{(2Q)^2}}] + \exp(-\frac{\omega_0 T}{Q})}{1 - \exp(-\frac{\omega_0 T}{Q})}$ |
| (7) | Q=0.5 | | |
| (2) | Q=2 | | |
| (5) | Q=1 | FIRST ORDER APPROXIMATION (DOTTED LINE) | $K_1 = \omega_0 T Q$ |
| (8) | Q=0.5 | | |
| (3) | Q=2 | | |
| (6) | Q=1 | THIRD ORDER APPROXIMATION (CHAIN DOUBLE-DASHED LINE) | $K_1 = \omega_0 T Q \cdot \{1 - \frac{1}{12}(\omega_0 T)^2\}$ |
| (9) | Q=0.5 | | |

| | | | |
|---|---|---|---|
| (1) | Q=1 | EXPRESSION 9 (SOLID LINE) | $K_2 = 1 - \exp(-\frac{\omega_0 T}{Q})$ |
| (5) | Q=2 | | |
| (2) | Q=1 | FIRST ORDER APPROXIMATION (DOTTED LINE) | $K_2 = \frac{\omega_0 T}{Q}$ |
| (6) | Q=2 | | |
| (3) | Q=1 | SECOND ORDER APPROXIMATION (CHAIN LINE) | $K_2 = \frac{\omega_0 T}{Q} \{1 - \frac{1}{2} \cdot \frac{\omega_0 T}{Q}\}$ |
| (7) | Q=2 | | |
| (4) | Q=1 | THIRD ORDER APPROXIMATION (CHAIN DOUBLE-DASHED LINE) | $K_2 = \frac{\omega_0 T}{Q} \{1 - \frac{1}{2} \cdot \frac{\omega_0 T}{Q} + \frac{1}{6} \cdot (\frac{\omega_0 T}{Q})^2\}$ |
| (8) | Q=2 | | |

FIG. 4

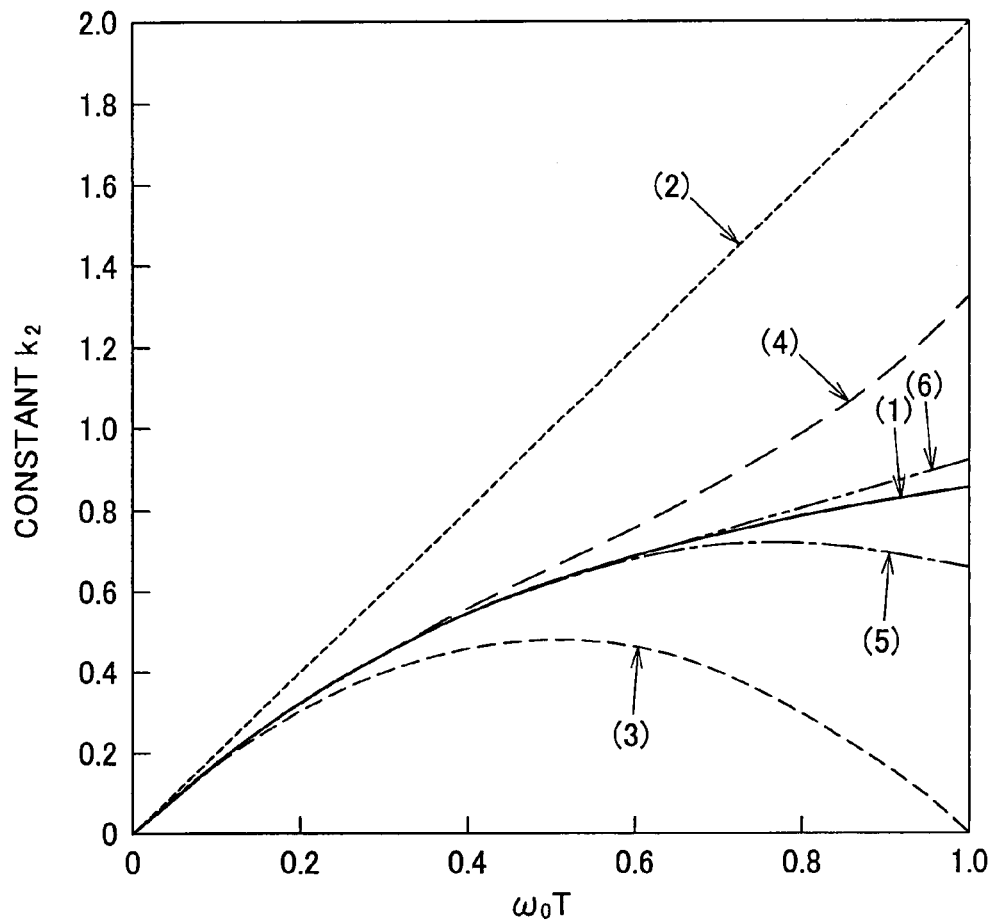

| | | | |
|---|---|---|---|
| (1) | Q=0.5 | EXPRESSION 9 (SOLID LINE) | $K_2 = 1 - \exp(-\frac{\omega_0 T}{Q})$ |
| (2) | Q=0.5 | FIRST ORDER APPROXIMATION (DOTTED LINE (FINE)) | $K_2 = \frac{\omega_0 T}{Q}$ |
| (3) | Q=0.5 | SECOND ORDER APPROXIMATION (DOTTED LINE (MIDDLE)) | $K_2 = \frac{\omega_0 T}{Q}\{1 - \frac{1}{2} \cdot \frac{\omega_0 T}{Q}\}$ |
| (4) | Q=0.5 | THIRD ORDER APPROXIMATION (DOTTED LINE (COARSE)) | $K_2 = \frac{\omega_0 T}{Q}\{1 - \frac{1}{2} \cdot \frac{\omega_0 T}{Q} + \frac{1}{6} \cdot (\frac{\omega_0 T}{Q})^2\}$ |
| (5) | Q=0.5 | FOURTH ORDER APPROXIMATION (CHAIN LINE) | $K_2 = \frac{\omega_0 T}{Q}\{1 - \frac{1}{2} \cdot \frac{\omega_0 T}{Q} + \frac{1}{6} \cdot (\frac{\omega_0 T}{Q})^2 - \frac{1}{24} \cdot (\frac{\omega_0 T}{Q})^3\}$ |
| (6) | Q=0.5 | FIFTH ORDER APPROXIMATION (CHAIN DOUBLE-DASHED LINE) | $K_2 = \frac{\omega_0 T}{Q}\{1 - \frac{1}{2} \cdot \frac{\omega_0 T}{Q} + \frac{1}{6} \cdot (\frac{\omega_0 T}{Q})^2 - \frac{1}{24} \cdot (\frac{\omega_0 T}{Q})^3 + \frac{1}{120} \cdot (\frac{\omega_0 T}{Q})^4\}$ |

CONFIGURATION OF DIRECT FORM I BIQUAD FILTER
(BI-LINEAR TRANSFORMATION)

CONFIGURATION OF DIRECT FORM II BIQUAD FILTER
(BI-LINEAR TRANSFORMATION)

CONFIGURATION OF DIRECT FORM I BIQUAD FILTER
(IMPULSE INVARIANT TRANSFORMATION)

DIGITAL LOW-PASS FILTER

INCORPORATION BY REFERENCE

The disclosure of Japanese Patent Application No. 2006-316184 filed on Nov. 22, 2006 including the specification, drawings and abstract is incorporated herein by reference in its entirety.

BACKGROUND OF THE INVENTION

1. Field of the Invention

The present invention relates to a digital filter, and more particularly, to a recursive IIR (Infinite Impulse Response) digital low-pass filter. The present invention also relates to a method of constructing an operation flow used in a cut-off frequency-variable digital filter that has a small circuit scale, and of which cost is low.

2. Description of the Related Art

Examples of digital low pass filters that are used to, for example, eliminate unwanted frequency components, other than desired frequency components, from digital data obtained by discrete time sampling of an analog signal include a decimation filter that eliminates quantization noise in a high frequency region of a digital input signal in a $\Delta\Sigma$ A/D (analog-to-digital) converter.

In general, the configuration of a digital low pass filter is classified broadly into the recursive filter and the non-recursive filter. From the view point of reducing manufacturing costs, the recursive filter in which the amount of calculation and the number of filter coefficients are relatively small is more suitable. Except for some exceptions, the recursive filter is an IIR filter, that is, a filter in which duration of an impulse response is infinite. Hereinafter, the recursive filter is referred to as the IIR filter for convenience of explanation.

Design of an IIR filter is performed according to the following steps (1) to (3). (1) The characteristics of a reference analog filter (that includes a cut-off frequency $f_0$ and a quality factor Q), and a transfer function H(s) in the s-domain (s=jω: complex (angular) frequency, ω=2πf: angular frequency) of the analog filter are determined based on the frequency characteristic required of the IIR filter. In general, each of the denominator and the numerator of a transfer function H(s) is represented by a polynomial of s, and the transfer function H(s) as a whole is a rational function of s. (2) The transfer function H(s) in the s-domain is transformed into a transfer function H(z) in the z-domain, that is, the so-called s-z transformation is performed. (3) The transfer function H(z) in the z-domain is transformed into a difference equation to determine the operation flow (scheme) of the IIR filter.

As examples of the above s-z transformation, the impulse-invariant transformation, and the bi-linear transformation are known. In particular, the bi-linear transformation is frequently used in standard methods of designing digital filters.

As the operation flow (scheme) of the IIR filter, the direct form I and the direct form II are used in many cases.

With regard to the configuration of third or higher order filters among such IIR filters, as shown in FIG. 15, a cascaded filter which is obtained by factorizing the s-domain transfer function H(s) of an IIR filter into the product of a transfer function of a first order filter and a transfer function of a second order filter (biquad filter), and cascading the first order filter and the second order filter, is known. In general, it is known that the calculation error in finite length calculation that occurs in a cascaded filter is small, and the first and second order filters may therefore be regarded as the basic components of an IIR filter.

With regard to such second order filters (biquad filters), in the case where the s-domain transfer function H(s) of a biquad low-pass filter is s-z transformed into a z-domain transfer function H(z) by the bi-linear transformation, H(z) becomes a rational function in which each of the denominator and the numerator is represented by a quadratic function of z as shown by the following expression 5.

$$H(z) = \frac{a_0 + a_1 \cdot z^{-1} + a_2 \cdot z^{-2}}{1 + b_1 \cdot z^{-1} + b_2 \cdot z^{-2}} \quad \text{(Expression 5)}$$

According to the expression 5, the number of filter coefficients of the above biquad low-pass filter is five ($a_0$, $a_1$, $a_2$, $b_1$, and $b_2$). Operation flow diagrams of the direct form I and the direct form II showing such biquad low-pass filters are as shown in FIGS. 16A and 16B, respectively.

With regard to such biquad low-pass filters, in the case where the s-domain transfer function H(s) of a biquad low-pass filter is s-z transformed into a z-domain transfer function H(z) by the impulse-invariant transformation, H(z) becomes a rational function in which each of the denominator and the numerator is represented by a quadratic function of z as shown by the following expression 6.

$$H(z) = \frac{a_0 \cdot z^{-1}}{1 + b_1 \cdot z^{-1} + b_2 \cdot z^{-2}} \quad \text{(Expression 6)}$$

According to the expression 6, the number of filter coefficients of the above biquad low-pass filter is three ($a_0$, $b_1$ and $b_2$). An operation flow diagram of the direct form I showing such a biquad low-pass filter is as shown in FIG. 17.

In general, a low frequency gain $A_0$ of the analog biquad low-pass filter may be assumed to be 1. Hence, it is possible to set the characteristics of an analog biquad low-pass filter by determining two characteristic parameters of the cut-off frequency $f_0$ and the quality factor Q.

However, when the analog filter is replaced by a digital filter with the use of the conventional direct form I or direct form II as described above, at least three multiplications are required for calculation related to the filter coefficients in one operation cycle. Examples of such digital filters include a digital filter described in Japanese Patent Application Publication No. 10-150344 (JP-A-10-150344).

Because a multiplication operation in a digital filter is performed by repeating an addition operation a certain number of times corresponding to the number of bits of the input data, the multiplier (multiplication circuit) is constituted of full adders the number of which is equal to the square of the number of bits of the input data. Hence, in general, a multiplier has a large circuit scale as compared to an adder or a subtracter. On top of that, there is a problem that the larger the number of bits of the input data becomes because a high degree of operation accuracy is required, the stronger such a tendency becomes. Specifically, the filter coefficient of the transfer function H(z) obtained by performing an s-z transformation is not a simple value (such as $2^n$, or $\frac{1}{2}^n$) that can be expressed by one bit, and requires ten to ten-odd bits for calculation (or more when a high degree of operation accuracy is required) in general. Thus, when a multiplier that performs such multiplication operations of input data is realized as an actual circuit, the multiplier becomes very large as compared to an adder or a subtracter.

As a measure for avoiding that an arithmetic circuit becomes large, one that is conceivable is to reduce the operation bit number in a multiplier. In this case, however, calculation errors due to rounding down occur, and the operation bit number cannot be easily reduced when a high degree of operation accuracy is required.

A further problem is that, when it is desired to make the characteristics of a digital filter variable, such as when it is desired to change the cut-off frequency $f_0$, the quality factor Q, or the low frequency gain $A_0$ according to the environment of the circuit, the kind of input data (digital signal), etc., use of the operation flow according to the direct form I or the direct form II causes the circuit scale to become large. For example, when, in the operation flow obtained using the bi-linear transformation, the cut-off frequency $f_0$ is made variable, the filter coefficients of the transfer function H(z) cannot be expressed by simple expressions, such as an expression proportional to the cut-off frequency $f_0$, and, in general, the filter coefficients are expressed by second or higher order polynomials, or more complicated expressions. Attempt to realize this will result in a large circuit scale.

With regard to low-pass filters, it is often the case that the low frequency gain $A_0$ is required to be one or a constant value independently of the cut-off frequency $f_0$ and the quality factor Q. When a filter coefficient is changed to change the cut-off frequency $f_0$ and the quality factor Q, the operation bit number for the filter coefficient in an operation is also changed depending on the operation formula, which causes rounding up or rounding down, resulting in a change in the low frequency gain $A_0$. In the case of a decimation filter for a $\Delta\Sigma$ A/D converter, for example, it is often the case that a high degree of output accuracy involving 16 to 24 bits is required in a low frequency region. When the low frequency gain varies due to a change of the filter coefficient, the DC level of output signals also varies even when the DC level of input signals is constant, which makes it difficult to realize a digital low pass filter with a high degree of accuracy.

SUMMARY OF THE INVENTION

The present invention provides a digital low pass filter with which it is possible to reduce the amount of calculation, and therefore the circuit scale.

A digital low-pass filter according to an aspect of the present invention includes: a first subtracter that outputs a signal obtained by subtracting a first feedback term from an input signal; a first multiplier that outputs a signal obtained by multiplying the output signal from the first subtracter by a constant $k_1$; a first delay unit that outputs a signal obtained by delaying an input signal by a predetermined sampling time; a first adder that outputs a signal obtained by adding the output signal from the first multiplier to the output signal from the first delay unit, wherein the output signal from the first adder is supplied to the first delay unit; a second subtracter that outputs a signal obtained by subtracting the first feedback term from the output signal from the first adder; a second multiplier that outputs a signal obtained by multiplying the output signal from the second subtracter by a constant $k_2$; a second delay unit that outputs, as the first feedback term, a signal obtained by delaying an input signal by a predetermined sampling time; and a second adder that outputs a signal obtained by adding the output signal from the second multiplier to the output signal from the second delay unit, wherein the output signal from the second adder is supplied to the second delay unit.

The constant $k_1$ may be set according to the following expression 1 or 2 with the use of a desired sampling period T, a desired quality factor Q, and a desired cut-off frequency $f_0$, and the constant $k_2$ may be set according to the following expression 3 or 4 with the use of the desired sampling period T, the desired quality factor Q, and the desired cut-off frequency $f_0$:

$$k_1 = 2\pi f_0 TQ; \quad \text{(Expression 1)}$$

$$k_1 = 2\pi f_0 TQ\{1 - A \cdot (2\pi f_0 T)^2\} (0 \leq A \leq 1); \quad \text{(Expression 2)}$$

$$k_2 = 2\pi f_0 T/Q; \text{ and} \quad \text{(Expression 3)}$$

$$k_2 = (2\pi f_0 T/Q)\{1 - (\tfrac{1}{2})(2\pi f_0 T/Q) + B \cdot (2\pi f_0 T/Q)^2\} \\ (0 \leq B \leq 1). \quad \text{(Expression 4)}$$

The digital low-pass filter may further include an additional delay unit, placed at a previous stage relative to the first subtracter or a following stage relative to the second adders that outputs a signal obtained by delaying an input signal by a predetermined sampling time.

The digital low-pass filter may further include a moving average filter, placed at a following stage relative to the second adder, that outputs a moving average of an input signal.

The ratio between the constants $k_1$ and $k_2$ may be set to 1:2.

The ratio between the constants $k_1$ and $k_2$ may be set to 1:3.

The digital low-pass filter may further include: a third subtracter that outputs a signal obtained by subtracting a second feedback term from an input signal; a third multiplier that outputs a signal obtained by multiplying the output signal from the third subtracter by a constant $k_3$; a third delay unit that outputs, as the second feedback term, a signal obtained by delaying an input signal by a predetermined sampling time; and a third adder that outputs a signal obtained by adding the output signal from the third multiplier to the output signal from the third delay unit, wherein the output signal from the third adder is supplied to the third delay unit. The third subtracter, the third multiplier, the third delay unit, and the third adder may be placed at a previous stage relative to the first subtracter, or a following stage relative to the second adder, and a ratio between the constants $k_1$, $k_2$, and $k_3$ may be set to 1:1:1.

The constants $k_1$ and $k_2$ may be variable.

The constants $k_1$ and $k_2$ may be varied substantially proportionally to the cut-off frequency $f_0$.

The constant $k_1$ may be fixed, and the constant $k_2$ may be variable.

The operation data length in the second multiplier may be set smaller than the operation data length in the first multiplier.

An advantageous effect of the present invention is that the amount of calculation, and therefore the circuit scale is reduced.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein:

FIG. 4 is also a diagram showing variations of the constant $k_2$ when the product of the angular frequency and the sampling period is varied;

DETAILED DESCRIPTION OF EMBODIMENTS

A digital low-pass filter 100, which is a first embodiment of the digital low-pass filter according to the present invention, will be described below with reference to FIGS. 1 to 4.

Figure 1:
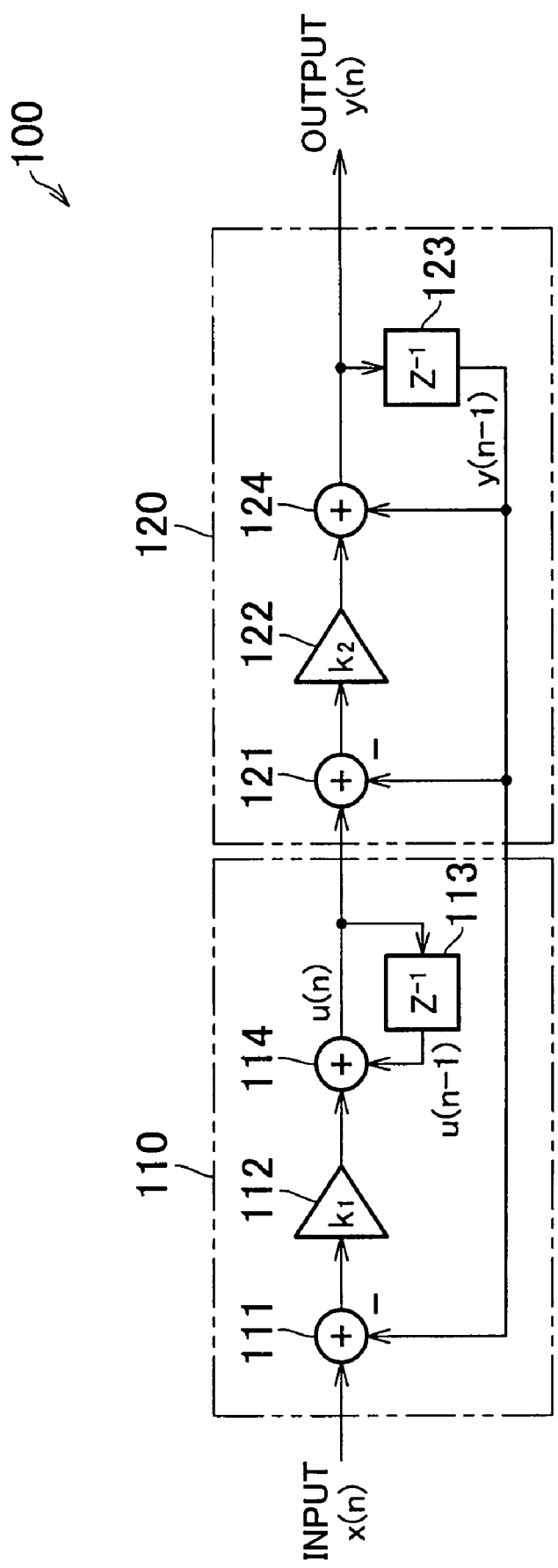
FIG. 1 is a diagram showing a first embodiment of a digital low-pass filter according to the present invention.

As shown in FIG. 1, the digital low-pass filter 100 generally includes a former stage section 110 and a latter stage section 120. The former stage section 110 includes a first subtracter 111, a first multiplier 112, a first delay unit 113, and a first adder 114. The latter stage section 120 includes a second subtracter 121, a second multiplier 122, a second delay unit 123, and a second adder 124.

The first subtracter 111 outputs a signal obtained by subtracting a first feedback term from an input signal. The "input signal" implies data sent from a previous stage. In the case of the first subtracter 111 of the first embodiment, the input signal is input data in the form of a digital signal train (digital data, having a predetermined number of bits, which is input to the digital low-pass filter 100, and corresponds to an input signal train x(n) described later). The "first feedback term" will be described later.

The first multiplier 112 outputs a signal obtained by multiplying the output signal from the first subtracter 111 (that is, the signal obtained by subtracting the first feedback term from the input data in the form of a digital signal train) by a constant $k_1$. Details of the constant $k_1$ will be described later.

The first delay unit 113 outputs a signal obtained by delaying an input signal by a predetermined sampling time. In the case of the first embodiment, the "input signal" supplied to the first delay unit 113 is the output signal from the first adder 114 described later. The length of the "predetermined sampling time" is typically one sampling period in a digital circuit or the like to which the digital low-pass filter is applied. However, the length of the predetermined sampling time may be appropriately selected depending on the application or the like of the digital low-pass filter.

The first adder 114 outputs a signal obtained by adding the output signal from the first multiplier 112 (the signal obtained by multiplying the output signal from the first subtracter 111 by the constant $k_1$) to the output signal from the first delay unit 113 (the signal obtained by delaying the input signal supplied to the first delay unit 113 by the predetermined sampling time), and supplies the signal to the first delay unit 113. It should be noted that the output signal from the first adder 114 is not only the input signal supplied to the first delay unit 113, but also the input signal supplied to the second subtracter 121 described later.

The second subtracter 121 outputs a signal obtained by subtracting the first feedback term from the output signal from the first adder 114 (the signal obtained by adding the output signal from the first multiplier 112 to the output signal from the first delay unit 113). The "first feedback term" will be described later.

The second multiplier 122 outputs a signal obtained by multiplying the output signal from the second subtracter 121 (the signal obtained by subtracting the first feedback term from the output signal from the first adder 114) by a constant $k_2$. Details of the constant $k_2$ will be described later.

The second delay unit 123 outputs, as the first feedback term, a signal obtained by delaying the input signal by a predetermined sampling period. Thus, the "first feedback term" supplied to the first subtracter 111 and the second subtracter 121 of the embodiment is the output signal from the second delay unit 123. In the case of the first embodiment, the "input signal" supplied to the second delay unit 123 is the output signal from the second adder 124 described later. The length of the "predetermined sampling time" is typically one sampling period in a digital circuit or the like to which the digital low-pass filter is applied as in the case of the above-described first delay unit 113. However, the length of the predetermined sampling time may be appropriately selected depending on the application or the like of the digital low-pass filter.

The second adder 124 outputs a signal obtained by adding the output signal from the second multiplier 122 (the signal obtained by multiplying the output signal from the second subtracter 121 by the constant $k_2$) to the output signal from the second delay unit 123 (the signal obtained by delaying the input signal supplied to the second delay unit 123 by the predetermined sampling period). The output signal from the second adder 124 is supplied to the second delay unit 123. It should be noted that, in this embodiment, the output signal from the second adder 124 (the signal obtained by adding the output signal from the second multiplier 122 to the output signal from the second delay unit 123) is not only supplied to the second delay unit 123, but also used as the output data of the digital low-pass filter 100 (the output signal from the second adder 124 is output as the output data of the digital low-pass filter 100).

Assuming that the input signal train (input data in the form of a digital signal train) supplied to the digital low-pass filter 100 is x(n), that the output signal train (output data) from the digital low-pass filter 100 is y(n), and that the signal train (output signal) from the first adder 114 is u(n), an operation flow (scheme) of the digital low-pass filter 100 is represented by the following expressions 7 and 8.

$$u(n)=k_1 \cdot (x(n)-y(n-1))+u(n-1) \quad \text{(Expression 7)}$$

$$y(n)=k_2 \cdot (u(n)-y(n-1))+y(n-1) \quad \text{(Expression 8)}$$

As shown by the expressions 7 and 8, in the operation flow (scheme) of the digital low-pass filter 100, the intermediate (third) signal train u(n) is defined in addition to the input signal train x(n) supplied to the digital low-pass filter 100 and the output signal train y(n) output from the digital low-pass filter 100, and each of a subtraction, a multiplication by a coefficient, and a integration is repeated two times. The constant $k_1$ in the expression 7, and the constant $k_2$ in the expression 8 are filter coefficients, and it is possible to realize the digital low-pass filter 100 with the use of two multipliers (the first multiplier 112 and the second multiplier 122) and two filter coefficient memories. In this way, without using the conventional operation flow of the direct form or the like that is obtained from a difference equation between the input signal train x(n) and the output signal train y(n), or a z-domain transfer function H(z)=Y(z)/X(z), and instead, by defining a intermediate (third) signal train u(n) in the operation flow (scheme) of the digital low-pass filter 100, it is possible to minimize the number of times a multiplication is performed when an analog filter is replaced by a corresponding digital filter.

As described above, the digital low-pass filter 100 includes: the first subtracter 111 that outputs a signal obtained by subtracting the first feedback term from the input signal (in the case of this embodiment, the input data in the form of a digital signal train); the first multiplier 112 that outputs a signal obtained by multiplying the output signal from the first subtracter 111 by the constant $k_1$; the first delay unit 113 that outputs a signal obtained by delaying the input signal (in the case of this embodiment, the output signal from the first adder 114); the first adder 114 that outputs a signal obtained by adding the output signal from the first multiplier 112 to the output signal from the first delay unit 113, and supplies the signal to the first delay unit 113; the second subtracter 121 that outputs a signal obtained by subtracting the first feedback term from the output signal from the first adder 114; the second multiplier 122 that outputs a signal obtained by multiplying the output signal from the second subtracter 121 by the constant $k_2$; the second delay unit 123 that outputs, as the first feedback term, a signal obtained by delaying the input signal (in the case of this embodiment, the output signal from the second adder 124) by the predetermined sampling time; and the second adder 124 that outputs a signal obtained by adding the output signal from the second multiplier 122 to the output signal from the second delay unit 123, and supplies the signal to the second delay unit 123.

Figure 16A:
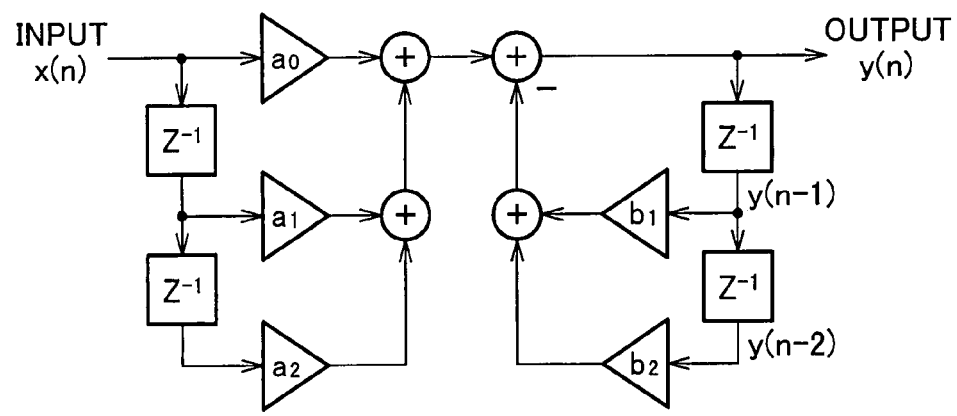
FIG. 16A is a diagram showing a configuration of a direct form I filter obtained using the bi-linear transformation.
Figure 16B:
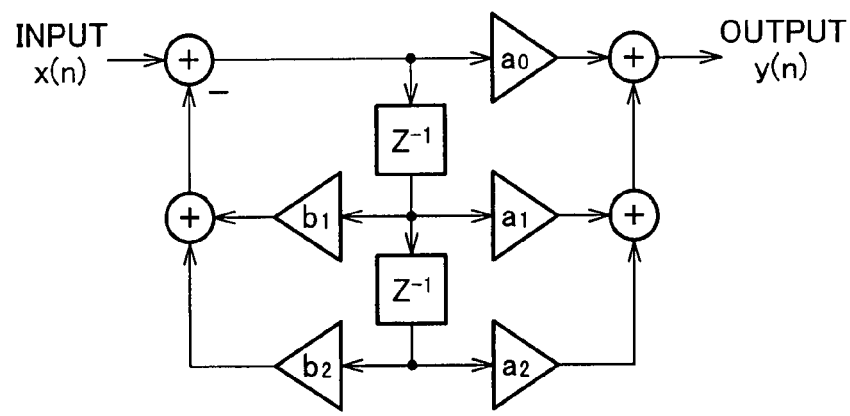
FIG. 16B is a diagram showing a configuration of a direct form II filter obtained using the bi-linear transformation.
Figure 17:
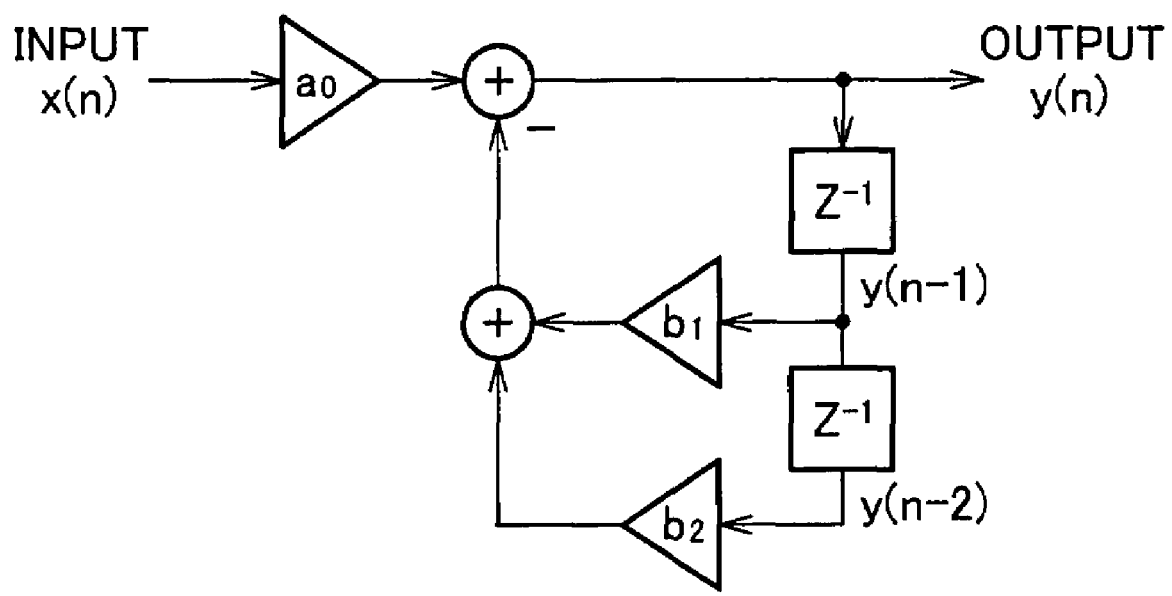
FIG. 17 is a diagram showing a configuration of a direct form I filter obtained using the impulse invariant transformation.

With such a configuration, the following advantageous effects are achieved. Specifically, it is possible to realize the digital low-pass filter 100 with the use of two multipliers (the first multiplier 112 and the second multiplier 122) and two filter coefficient memories, the digital low-pass filter 100 using simple elements (circuits), such as adders, subtracters, and delay units as the other components. Thus, it is possible to reduce the number of multipliers that exerts a significant influence on the scale of a circuit, as compared to the case where the operation flow according to the direct form I or the direct form II of the related art (see FIGS. 16 and 17) is used. The digital low-pass filter 100 shown in FIG. 1 has a configuration in which the number of additions and subtractions performed is four in total, the number of multiplications performed is two, and the number of times a signal is delayed is two. The direct form digital filter of the related art shown in FIG. 17 has a configuration in which the number of additions and subtractions performed is two in total, the number of multiplications performed is three, and the number of times a signal is delayed is two. Consequently, with regard to additions and subtractions in the digital low pass filter 100, the number of times of calculations is larger than that in the case of a conventional one. However, because a multiplication corresponds to additions the number of which is equal to the number of bits of the operated data, the digital low-pass filter 100 makes it possible to significantly reduce the actual amount of calculation and the scale of the circuit as compared to those of direct form digital filters of the related art shown in FIG. 17.

With regard to the operation performed in the former stage section 110 and the operation performed in the latter stage section 120, the input values (x(n), u(n)) are different from each other, and the constants ($k_1$, $k_2$) used in multiplication are different from each other, but the operation types are substantially the same. For this reason, it is possible to use the same arithmetic circuit (arithmetic core), and cause the arithmetic circuit to repeatedly perform operations while changing the input data and the coefficient used when a multiplication is performed. Accordingly, actual realization of a circuit is achieved with the use of a single arithmetic core that includes a multiplier, and a single arithmetic subroutine in a software program. Thus, it is possible to further reduce the scale of a circuit.

In the case of direct form digital filters according to the related art, the number of bits of an input supplied to a multiplier has to be equal to the number of bits of the input data and the output data supplied to and output from the digital filter, respectively. However, in the case of the digital low-pass filter 100, when sudden variation in the input signal supplied to the digital low-pass filter 100 is restricted by the former stage circuit or the like (that is, when variation in the input signal supplied to the digital low-pass filter 100 is limited to a predetermined range), the number of bits of the output from the subtracters (the first subtracter 111 and the second subtracter 121) is less than the number of bits of the input data supplied to the digital low-pass filter 100, so that it is possible to reduce the number of bits of the inputs supplied to the multipliers (the first multiplier 112 and the second multiplier 122) to reduce the scale of the circuits of the multipliers. Even when a sudden variation in the input signal (input data) that is supplied to the digital low-pass filter 100 occurs, and the numbers of bits of the inputs supplied to the multipliers (the first multiplier 112 and the second multiplier 122) exceed the numbers of operation bits of the multipliers to cause an arithmetic overflow, by adopting a configuration in which the signal output from a multiplier when the arithmetic overflow occurs is clamped at a maximum value, only the gradient (differential coefficient) of the output variation is restricted, which rarely becomes a problem of functions of a digital low-pass filter. In addition, by using floating-point multipliers, it is possible to easily solve a problem.

As a result, in the digital low-pass filter 100, by reducing the number of multipliers, it is possible to reduce the amount of calculation as a whole and to reduce the scale of a circuit as a whole. Thus, it is possible to reduce costs of manufacturing circuits. The digital low pass filter 100 is advantageous especially when the operation data length (the number of bits of the processed data) is long, such as when a high degree of operation accuracy is required.

A method of setting the constants $k_1$ and $k_2$ in the digital low-pass filter 100 will be described below. Although some methods can be imagined as the method of setting the constants $k_1$ and $k_2$, an example of the method of setting the constants $k_1$ and $k_2$ that is based on a concept similar to that of the so-called "impulse invariant transformation", in which the impulse response of an analog filter and the impulse response of a digital filter are matched, will be described below.

The constant $k_2$ in the digital low-pass filter 100 is expressed by the following expression 9 using a cut-off frequency $f_0$, a cut-off angular frequency $\omega_0$ ($=2\pi f_0$), a quality factor Q, a sampling frequency fs, and a sampling period T ($=1/fs$).

$$k_2 = 1 - \exp\left(-\frac{\omega_0 T}{Q}\right) \quad \text{(Expression 9)}$$

When the quality factor $Q \leq \frac{1}{2}$, the constant $k_1$ in the digital low-pass filter 100 is expressed by the following expression 10 using the cut-off frequency $f_0$, the cut-off angular frequency $\omega_0$ ($=2\pi f_0$), the quality factor Q, the sampling frequency fs, and the sampling period T ($=1/fs$).

$$k_1 = \frac{1 - \exp\left(-\frac{\omega_0 T}{2Q}\right) \cdot \left[\begin{array}{c} \exp\left\{\frac{\omega_0 T}{2Q}\sqrt{1-(2Q)^2}\right\} + \\ \exp\left\{-\frac{\omega_0 T}{2Q}\sqrt{1-(2Q)^2}\right\} \end{array}\right] + \exp\left(-\frac{\omega_0 T}{Q}\right)}{\left(1 - \exp\left(-\frac{\omega_0 T}{Q}\right)\right)} \quad \text{(Expression 10)}$$

When the quality factor $Q > \frac{1}{2}$, the constant $k_1$ in the digital low-pass filter 100 is expressed by the following expression 11 using the cut-off frequency $f_0$, the cut-off angular frequency $\omega_0$ ($=2\pi f_0$), the quality factor Q, the sampling frequency fs, and the sampling period T ($=1/fs$). When $Q=\frac{1}{2}$, the expression 10 becomes the same as the expression 11.

$$k_1 = \frac{1 - 2\exp\left(-\frac{\omega_0 T}{2Q}\right) \cdot \cos\left\{\omega_0 T\sqrt{1-\frac{1}{(2Q)^2}}\right\} + \exp\left(-\frac{\omega_0 T}{Q}\right)}{1 - \exp\left(-\frac{\omega_0 T}{Q}\right)} \quad \text{(Expression 11)}$$

As shown by the expressions 9, 10, and 11, the constants $k_1$ and $k_2$ are expressed by complex expressions including exponential functions and trigonometric functions. In particular, with regard to the constant $k_1$, it is necessary to consider separately the cases of different values of the quality factor Q (the expression 10 or 11), which is relatively complicated. When $\omega_0 T/Q \ll 1$ and $\omega_0 T \ll 1$, by performing a polynomial approximation (nth-order approximation) by performing a Taylor expansion of the expressions 10 and 11, the constants $k_1$ and $k_2$ in the digital low-pass filter 100 can be expressed by the following expressions 12 and 13, respectively.

$$k_1 \approx \omega_0 TQ \cdot \left\{1 - \frac{1}{12}(\omega_0 T)^2\right\} \approx \omega_0 TQ \quad \text{(Expression 12)}$$

-continued $$k_2 \approx \frac{\omega_0 T}{Q}\left\{1 - \frac{1}{2!} \cdot \frac{\omega_0 T}{Q} + \frac{1}{3!} \cdot \left(\frac{\omega_0 T}{Q}\right)^2 - \frac{1}{4!} \cdot \left(\frac{\omega_0 T}{Q}\right)^3 + \frac{1}{5!} \cdot \left(\frac{\omega_0 T}{Q}\right)^4 + \ldots\right\} \quad \text{(Expression 13)}$$

$$\approx \frac{\omega_0 T}{Q}\left\{1 - \frac{1}{2} \cdot \frac{\omega_0 T}{Q} + \frac{1}{6} \cdot \left(\frac{\omega_0 T}{Q}\right)^2 - \frac{1}{24} \cdot \left(\frac{\omega_0 T}{Q}\right)^3\right\}$$

$$\approx \frac{\omega_0 T}{Q}\left\{1 - \frac{1}{2} \cdot \frac{\omega_0 T}{Q} + \frac{1}{6} \cdot \left(\frac{\omega_0 T}{Q}\right)^2\right\}$$

$$\approx \frac{\omega_0 T}{Q}\left\{1 - \frac{1}{2} \cdot \frac{\omega_0 T}{Q}\right\}$$

$$\approx \frac{\omega_0 T}{Q}$$

Figure 2:
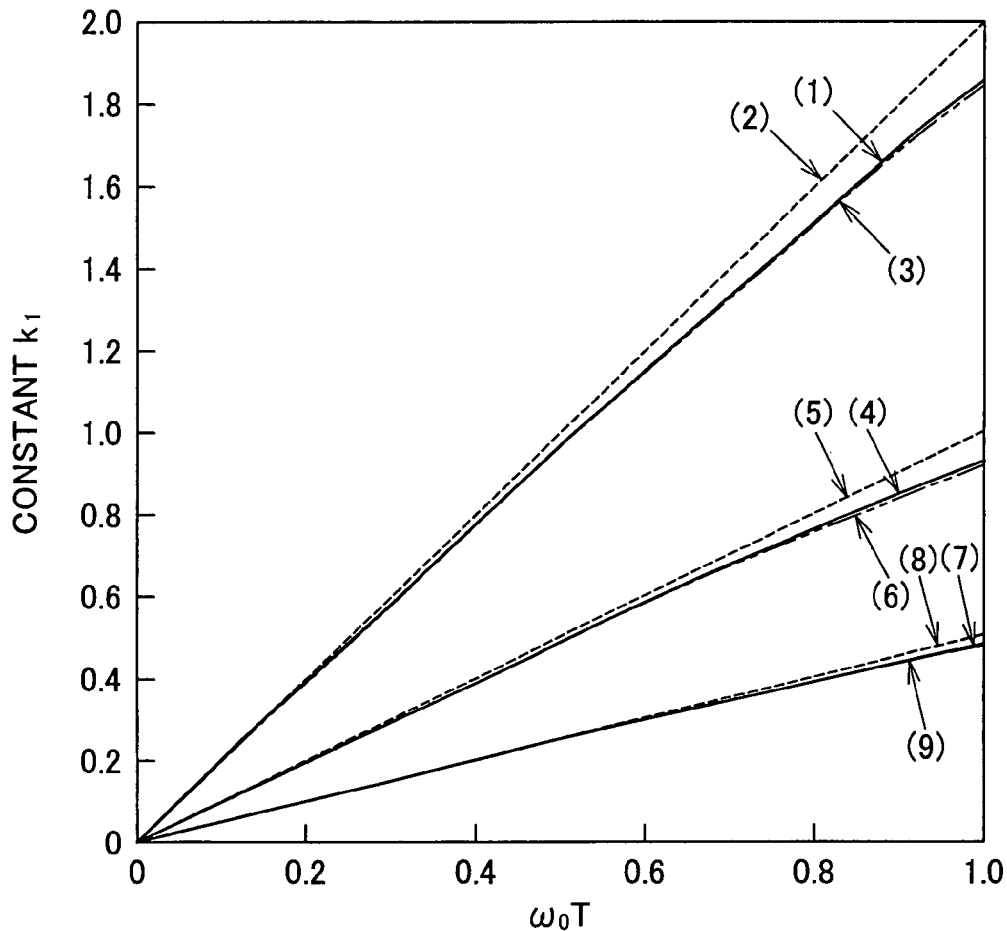
FIG. 2 is a diagram showing variations of a constant $k_1$ when the product of an angular frequency and a sampling period is varied.
Figure 3:
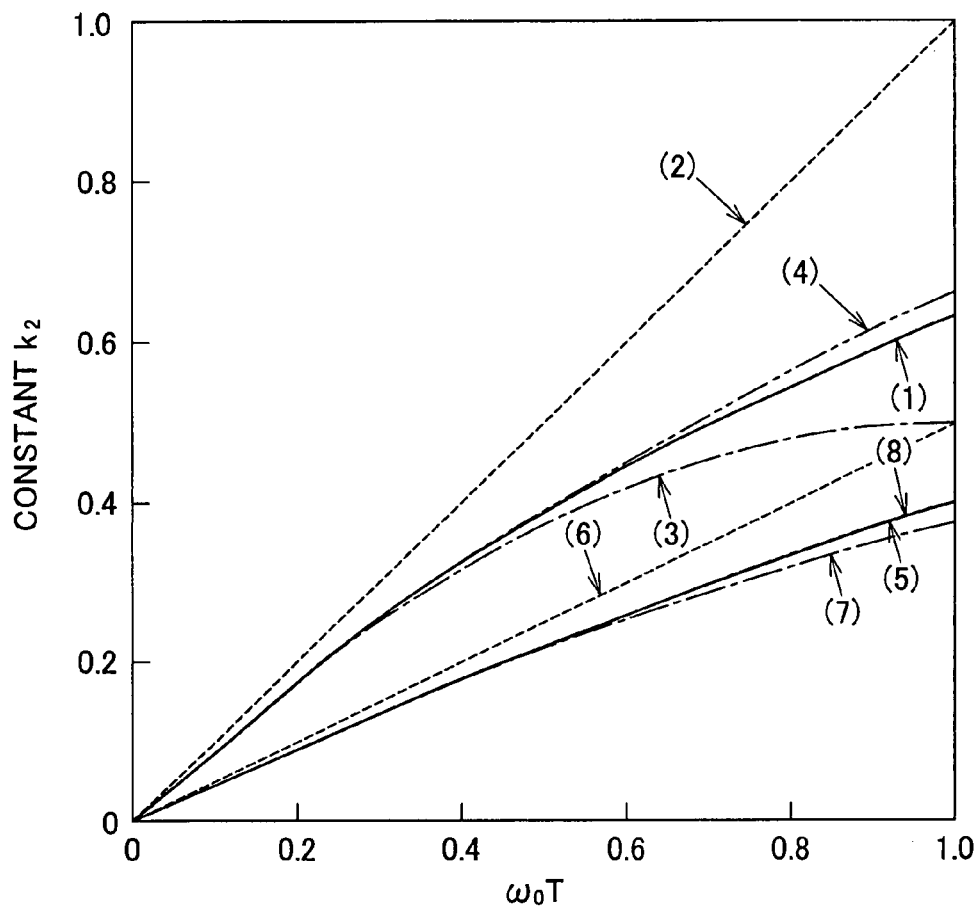
FIG. 3 is a diagram showing variations of a constant $k_2$ when the product of the angular frequency and the sampling period is varied.

Referring to FIGS. 2 to 4, a description will be given of errors between the constant $k_1$ and its nth-order approximation, and between the constant $k_2$ and its nth-order approximation (that is, accuracy) that occur when the constants $k_1$ and $k_2$, expressed by the expressions 9 to 11, are dealt with using the nth-order approximations obtained by the Taylor expansion, expressed by the expressions 12 and 13.

FIG. 2 shows the expression of the constant $k_1$ (the expression 11), and the nth-order approximations thereof (expression 12) obtained by the Taylor expansion of the expression 11, and their curves for particular values of Q and $\omega_0 T$. In the case of Q=2, when $\omega_0 T<1$ (($f_0/fs$)<$1/(2\pi)$), the error between the expression of the constant $k_1$ ((1) in FIG. 2), expressed by the expression 11, and each of the first-order approximation ((2) in FIG. 2) and the third-order approximation ((3) in FIG. 2), obtained by the Taylor expansion, is no more than a few percent. In particular, the curve of the third-order approximation is almost coincident with the curve of the expression of the constant $k_1$ expressed by the expression 11. The same applies in the case of Q=1 ((4), (5), (6) in FIG. 2), and in the case of Q=0.5 ((7), (8), (9) in FIG. 2).

Thus, even when the constant $k_1$, which should be expressed by the complex expression like the expression 11, is expressed by the simple, first- or third-order approximation, or a higher order approximation, obtained by a Taylor expansion, which is expressed by the expression 12, it is possible to ensure sufficient accuracy required for the digital low-pass filter 100 to function as a digital filter.

FIG. 3 shows the expression of the constant $k_2$ (the expression 9), and the nth-order approximations thereof (the expression 13) obtained by the Taylor expansion of the expression 9, and their curves for particular values of Q and $\omega_0 T$ when the value of Q is relatively high (Q=1 or 2, for example). In the case of Q=1, when $\omega_0 T<0.628$ (($f_0/fs$)<$\frac{1}{10}$), the error between the expression of the constant $k_2$ ((1) in FIG. 3), expressed by the expression 9, and the third-order approximation thereof ((4) in FIG. 3), obtained by a Taylor expansion of the constant $k_2$, is no more than a few percent. In the case of Q=1, when $\omega_0 T<0.5$, the error between the expression of the constant $k_2$ ((1) in FIG. 3), expressed by the expression 9, and the second-order approximation thereof ((3) in FIG. 3), obtained by a Taylor expansion of the constant $k_2$, is no more than a few percent. In the case of Q=1, when $\omega_0 T<0.2$, the error between the expression of the constant $k_2$ ((1) in FIG. 3), expressed by the expression 9, and the first-order approximation thereof ((2) in FIG. 3), obtained by a Taylor expansion of the constant $k_2$, is no more than a few percent. In particular, the curve of the third-order approximation is almost coincident with the curve of the expression of the constant $k_2$ expressed by the expression 11. The same applies in the case of Q=2 ((5), (6), (7), (8) in FIG. 3).

Thus, in the case where the value of Q is relatively high (Q=1 or 2, for example), even when the constant $k_2$, which should be expressed by the complex expression like the expression 9, is expressed by the simple, first-, second-, or third-order approximation, or a higher order approximation, obtained by a Taylor expansion, which is expressed by the expression 13, it is possible to ensure sufficient accuracy required for the digital low-pass filter 100 to function as a digital filter.

FIG. 4 shows the expression of the constant $k_2$ (the expression 9), and the nth-order approximations thereof (the expression 13) obtained by the Taylor expansion of the expression 9, and their curves for particular values of Q and $\omega_0 T$ when the value of Q is relatively low (Q=0.5, for example). When the value of Q is relatively low (Q=0.5, for example), the value of $\omega_0 T/Q$ is higher than that in the case shown in FIG. 3 where the value of Q is relatively high (Q=1 or 2, for example). For this reason, in order to ensure filtering accuracy, approximation may be made using a relatively higher order approximation. In the case of Q=0.5, when $\omega_0 T<1$, the error between the expression of the constant $k_2$ ((1) in FIG. 4), expressed by the expression 9, and the fifth-order approximation thereof ((6) in FIG. 4), obtained by a Taylor expansion of the constant $k_2$, is no more than a few percent. In the case of Q=0.5, when $\omega_0 T<0.628$ (($f_0/fs$)<1/10), the error between the expression of the constant $k_2$ ((1) in FIG. 4), expressed by the expression 9, and the fourth-order approximation thereof ((5) in FIG. 4), obtained by a Taylor expansion of the constant $k_2$, is no more than a few percent. In the case of Q=0.5, when $\omega_0 T<0.4$ (($f_0/fs$)<1/16), the error between the expression of the constant $k_2$ ((1) in FIG. 4), expressed by the expression 9, and the third-order approximation thereof ((4) in FIG. 4), obtained by a Taylor expansion of the constant $k_2$, is no more than a few percent. In the case of Q=0.5, when $\omega_0 T<0.2$, the error between the expression of the constant $k_2$ ((1) in FIG. 4), expressed by the expression 9, and the second-order approximation thereof ((3) in FIG. 4), obtained by a Taylor expansion of the constant $k_2$, is no more than a few percent. In the case of Q=0.5, when $\omega_0 T<0.05$, the error between the expression of the constant $k_2$ ((1) in FIG. 4), expressed by the expression 9, and the first-order approximation thereof ((2) in FIG. 4), obtained by a Taylor expansion of the constant $k_2$, is no more than a few percent.

Thus, in the case where the value of Q is relatively low (Q=0.5, for example), even when the constant $k_2$, which should be expressed by the complex expression like the expression 9, is expressed by the simple, first-, second-, third-, fourth-, or fifth-order approximation, or a higher order approximation, obtained by a Taylor expansion, which is expressed by the expression 13, it is possible to ensure sufficient accuracy required for the digital low-pass filter 100 to function as a digital filter.

By setting the constant $k_1$ of the digital low-pass filter 100 according to the following expression 1 (which corresponds to the expression 12, and to the first-order approximation obtained by performing a Taylor expansion of the expression 10 or 11), or the following expression 2 (which corresponds to the third-order approximation obtained by performing a Taylor expansion of the expression 10 or 11) using a desired sampling period T, a desired quality factor Q, and a desired cut-off frequency $f_0$, and by setting the constant $k_2$ according to the following expression 3 (which corresponds to the expression 13, and to the first-order approximation obtained by performing a Taylor expansion of the expression 9), or the following expression 4 (which corresponds to the third-order approximation obtained by performing a Taylor expansion of the expression 9) using the desired sampling period T, the desired quality factor Q, and the desired cut-off frequency $f_0$, it is made possible to minimize complex calculations without reducing accuracy when the digital low-pass filter 100 is manufactured. Thus, it is made possible to reduce the scale of a circuit and manufacturing costs.

$$k_1 = 2\pi f_0 T Q \qquad \text{(Expression 1)}$$

$$k_1 = 2\pi f_0 T Q \{1 - A \cdot (2\pi f_0 T)^2\} \, 0 \leq A \leq 1 \qquad \text{(Expression 2)}$$

$$k_2 = 2 f_0 T/Q \qquad \text{(Expression 3)}$$

$$k_2 = (2\pi f_0 T/Q)\{1 - (1/2)(2\pi f_0 T/Q) + B \cdot (2\pi f_0 T/Q)^2\} \, 0 \leq B \leq 1 \text{ (Expression 4)}$$

The coefficient "A" in the expression 2, and the coefficient "B" in the expression 4 can take arbitrary values within the ranges, $0 \leq A \leq 1$ and $0 \leq B \leq 1$, respectively. For example, the coefficient A=1/12 and the coefficient B=1/6 may be chosen as shown in the expressions 12 and 13, respectively. In order to simplify calculations, the coefficients A and B may be appropriately chosen; A=1/16 (=1/2^4) and B=1/8 (=1/2^3), for example. In this case, there is almost no influence on the filtering accuracy, and it is made possible to use a bit shifter element (circuit) as a multiplier. Thus, it is possible to further reduce the scale of a circuit as a whole by reducing the scale of the circuit of a multiplier.

In addition, using the expressions 1 and 3, it is possible to approximately calculate the cut-off frequency $f_0$, and the quality factor Q from the filter coefficients (constants) $k_1$ and $k_2$, as shown by the following expressions 14 and 15.

$$\omega_0 \approx \frac{\sqrt{k_1 \cdot k_2}}{T} = fs \cdot \sqrt{k_1 \cdot k_2} \qquad \text{(Expression 14)}$$

$$f_0 = \frac{fs}{2\pi} \cdot \sqrt{k_1 \cdot k_2}$$

$$Q \approx \sqrt{\frac{k_1}{k_2}} \qquad \text{(Expression 15)}$$

In many cases where an analog filter is replaced by an IIR filter, a setting resolution (accuracy) of one percent to a few percent is required with regard to the cut-off frequency $f_0$ and the quality factor Q. However, a high setting resolution equal to or lower than 0.1% is rarely required. Thus, in order to achieve a setting resolution of one percent to a few percent with regard to the cut-off frequency $f_0$ and the quality factor Q using the above expressions 14 and 15 in the digital low-pass filter 100 of this embodiment, it suffices that the number of bits of the constants $k_1$ and $k_2$ is set to several bits (5 to 8 bits, for example). Accordingly, it is possible to reduce the scale of the circuits of multipliers (the first multiplier 112 and the second multiplier 122).

With regard to the digital low-pass filter 100, it is possible to approximate the quality factor Q by a simple expression composed of the filter coefficients (constants) $k_1$ and $k_2$ as shown by the expression 15, so that it is possible to easily achieve typical filter characteristics, such as the Butterworth characteristic (maximally flat characteristic) or the Bessel characteristic (linear phase characteristic) by appropriately selecting the ratio between the filter coefficients (constants) $k_1$ and $k_2$.

For example, in order to achieve a second-order Butterworth characteristic, it is necessary to use the quality factor $Q=(1/2)^{0.5}$. In the digital low-pass filter 100, it is possible to easily set the quality factor Q to approximately $(1/2)^{0.5}$ by setting the ratio between the constants $k_1$ and $k_2$ to 1:2 ($k_1$:$k_2$=1:2, based on the expression 15. In this case, $k_1=2\pi(f_0/fs)(1/2)^{0.5}$, and $k_2=2k_1$. Thus, in actuality, the number of the coefficient memories needed to realize the digital low-pass filter 100 is one (only the memory for storing the constant $k_1$ is used), which contributes to the reduction of the scale and cost of the digital low-pass filter 100.

In order to achieve a second-order Bessel characteristic, it is necessary to use the quality factor $Q=(1/3)^{0.5}$. In the digital low-pass filter 100, it is possible to easily set the quality factor Q to approximately $(1/3)^{0.5}$ by setting the ratio between the constants $k_1$ and $k_2$ to 1:3 ($k_1$:$k_2$=1:3), based on the expression 15. In this case, $k_1=2\pi(f_0/fs)(1/3)^{0.5}$, and $k_2=3k_1$. Thus, in actuality, the number of the coefficient memories needed to realize the digital low-pass filter 100 is one (only the memory for storing the constant $k_1$ is used), which contributes to the reduction of the scale and cost of the digital low-pass filter 100.

In order to achieve a third-order Butterworth characteristic, it is necessary to cascade a first order filter and a second order filter, and use the quality factor $Q=1$. When the digital low-pass filter 100 is the second order filter, it is possible to easily set the quality factor Q to approximately one by setting the ratio between the constants $k_1$ and $k_2$ to 1:1 ($k_1$:$k_2$=1:1), based on the expression 15. Details will be described later in connection with a digital low-pass filter 800 shown in FIG. 13. In this case, $k_1=2\pi(f_0/fs)$, and $k_2=k_1$. Thus, in actuality, the number of the coefficient memories needed to realize the digital low-pass filter 100 is one (only the memory for storing the constant $k_1$ is used), which contributes to the reduction of the scale and cost of the digital low-pass filter 100.

In particular, in the case where each of the values of the constants $k_1$ and $k_2$ is 2 to the nth power ($2^n$, where n is an integer), or an integer multiple of $2^n$ ($3 \times 2^n$, for example), it is possible to form each of the first multiplier 112 and the second multiplier 122 with the use of a small scale circuit constituted of a bit shifter circuit, or of a bit shifter circuit and a plurality of adders, instead of forming each of the first and second multipliers 112 and 122 with the use of multipliers in which the operation bit number is large (the scale of the circuit is therefore large), which contributes to the reduction of the scale and cost of the digital low-pass filter 100.

The digital low-pass filter 100 may have a configuration in which the constants $k_1$ and $k_2$ (the values thereof) are not fixed, but variable according to approximate expressions such as the expressions 1 to 4. When the constants $k_1$ and $k_2$ are variable, it is possible to change the cut-off frequency $f_0$ and the quality factor Q of the digital low-pass filter 100 according to the environment around the digital low-pass filter 100 (the circuit and/or the system in which the digital low-pass filter 100 is used, for example), the type of input data, etc. For example, when a sensor is connected to the digital low-pass filter 100 on the former stage side, it is possible to use the digital low-pass filter 100 to suppress noise by narrowing the detection bandwidth of the sensor according to the service conditions. In particular, in the case of the digital low-pass filter 100, the constants $k_1$ and $k_2$ are substantially proportional to the cut-off frequency $f_0$ (see the expressions 1 to 4), and it is therefore possible to easily set the cut-off frequency $f_0$ of the digital low-pass filter 100 to a desired value (that is, control the cut-off frequency $f_0$) by varying the values of the constants $k_1$ and $k_2$ while maintaining the ratio therebetween substantially at a constant value.

With regard to the digital low-pass filter 100, when a configuration is adopted in which the constant $k_1$ is fixed, and the constant $k_2$ is variable, the following advantageous effects are achieved. In general, a low frequency delay tD of a biquad filter is expressed by the following expression 16 using the cut-off angular frequency $\omega_0$ ($=2\pi f_0$) and the quality factor Q.

$$tD = \frac{1}{\omega_0 \cdot Q} \quad \text{(Expression 16)}$$

When the expressions 14 and 15 are substituted into the expression 16, the following expression 17 is obtained. In the expression 17, T ($=1/fs$) is the sampling period.

$$tD = \frac{1}{fs \cdot k_1} = \frac{T}{k_1} \quad \text{(Expression 17)}$$

As shown by the expression 17, the value of the low frequency delay tD can be expressed using the constant $k_1$ and the sampling period T. In general, because the sampling period T is fixed, the constant $k_1$ determines the value of the low frequency delay tD. Depending on the environment around the digital low-pass filter 100 (the circuit and/or the system in which the digital low-pass filter 100 is used, for example), it is required to maintain the value of the low frequency delay tD at a constant value, in some cases. In such a case, it is possible to change the cut-off frequency $f_0$ and the quality factor Q of the digital low-pass filter 100 according to the environment around the digital low-pass filter 100 (the circuit and/or the system in which the digital low-pass filter 100 is used, for example), the type of input data, etc., by changing the constant $k_2$ while maintaining the low frequency delay tD of the digital low-pass filter 100 substantially at a fixed amount by fixing the constant $k_1$.

When the constant $k_1$ of the digital low-pass filter 100 is fixed, and the constant $k_2$ thereof is set small, the cut-off frequency $f_0$ becomes low, while the low frequency delay tD remains substantially constant. In addition, the quality factor Q becomes large to make the cut-off characteristic curve steep, and the extent of overshoot and ringing increases. When the constant $k_1$ of the digital low-pass filter 100 is fixed, and the constant $k_2$ thereof is set large, the cut-off frequency $f_0$ becomes high, while the low frequency delay tD remains substantially constant. In addition, the quality factor Q becomes small to make the cut-off characteristic curve gentle, and the extent of overshoot and ringing is reduced.

The convergence of an output signal train will be described below. In the case where variation in an input signal train x(n) is small, and the difference between the input signal train x(n) and the output signal train y(n) of the digital low-pass filter 100 therefore becomes small (converges) to cause the difference values {x(n)-y(n)} and {u(n)-y(n)} to approach zero, when the operation data length (the operation bit number) in the first and second multipliers 112 and 122 is not large enough, the term $k_1(x(n)-y(n-1))$ in the expression 7, and the term $k_2(u(n)-y(n-1))$ in the expression 8 become zero by arithmetic rounding (rounding down). As a result, a problem arises that the output signal train y(n) does not vary any more, and does not converge to a required level (accuracy).

Such a problem of convergence of an output signal train mainly depends on the operation data length in the first multiplier 112. Assuming that the convergence accuracy required of the digital low-pass filter 100 corresponds to m bits, the required operation data length in the first multiplier 112 is at least $\{m+\log_2(1/k_1)\}$ bits. When the operation data length in the first multiplier 112 is less than this value, u(n) does not converge to a required convergence accuracy level due to rounding down, and the output signal train y(n) also does not converge to a required convergence accuracy level. Meanwhile, although the operation data length in the second multiplier 122 determines the resolution of the output signal train y(n) in the digital low-pass filter 100, the required operation data length in the second multiplier 122 is not necessarily {m+log$_2$(1/k$_1$)} bits. Although there is a slight difference in convergence time (time required for convergence), when the operation data length in the first multiplier 112 is large enough, the output signal train y(n) reaches a certain convergence level.

Even in the case where rounding down occurs in processing an output signal train y(n), and a certain convergence level is not reached, when the operation data length in the first multiplier 112 is large enough (that is, data is not truncated based on k$_1$), although there is a time lag, the difference value (x(n)−y(n−1)) becomes large because the output signal train y(n) does not reach a convergence point. For this reason, this value is integrated in the first multiplier to cause u(n) to overshoot, and thus, u(n) is raised to a level at which rounding down does not cause the result of the calculation, k$_2$·(u(n)−y(n−1)), performed in the second multiplier to be zero, so that the output signal train y(n) is lead to a convergence point. Specifically, even when rounding down occurs when calculation is performed in the second multiplier 122 because the operation data length in the second multiplier 122 is small, and the output signal train y(n) therefore does not immediately reach a convergence level, although the convergence time is slightly long, the output signal train y(n) ultimately reaches a required convergence accuracy level.

Thus, when the quality factor Q of the digital low-pass filter 100 is not significantly large (Q≦2, for example (see FIGS. 2 to 4)), and the constants k$_1$ and k$_2$ satisfy the following relations: k$_1$<1, k$_2$<1, and k$_1$≈k$_2$ or k$_1$<k$_2$, it is possible to reduce the scale of the digital low-pass filter 100 as a whole, and reduce the cost of the digital low-pass filter 100 without impairing the convergence performance by setting the length L$_2$ of the operated data (the operation bit number) in the second multiplier 122 shorter than the length L$_1$ of the operated data (the operation bit number) in the first multiplier 112 (L$_1$>L$_2$) to accordingly reduce the amount of calculation in the second multiplier 122 and the scale of the circuit thereof.

Assuming that the final output resolution of the digital low-pass filter 100 is n bits, the convergence accuracy d of the output signal train y(n) output from the digital low-pass filter 100 is expressed by the following expression 18. It should be noted that FS in the expression 18 means "Full Scale."

$$n = \log_2(d/FS) \quad \text{(Expression 18)}$$

When the length L$_1$ of the operated data in the first multiplier 112 and the length L$_2$ of the operated data in the second multiplier 122 satisfy the condition expressed by the following expression 19, it is possible to achieve a convergence accuracy d of the output signal train output from the digital low-pass filter 100.

$$L_1 \geq \log_2(d/FS) - 1 + \log_2(1/k_1) > L_2 \geq \log_2(d/FS) \quad \text{(Expression 19)}$$

Figure 5:
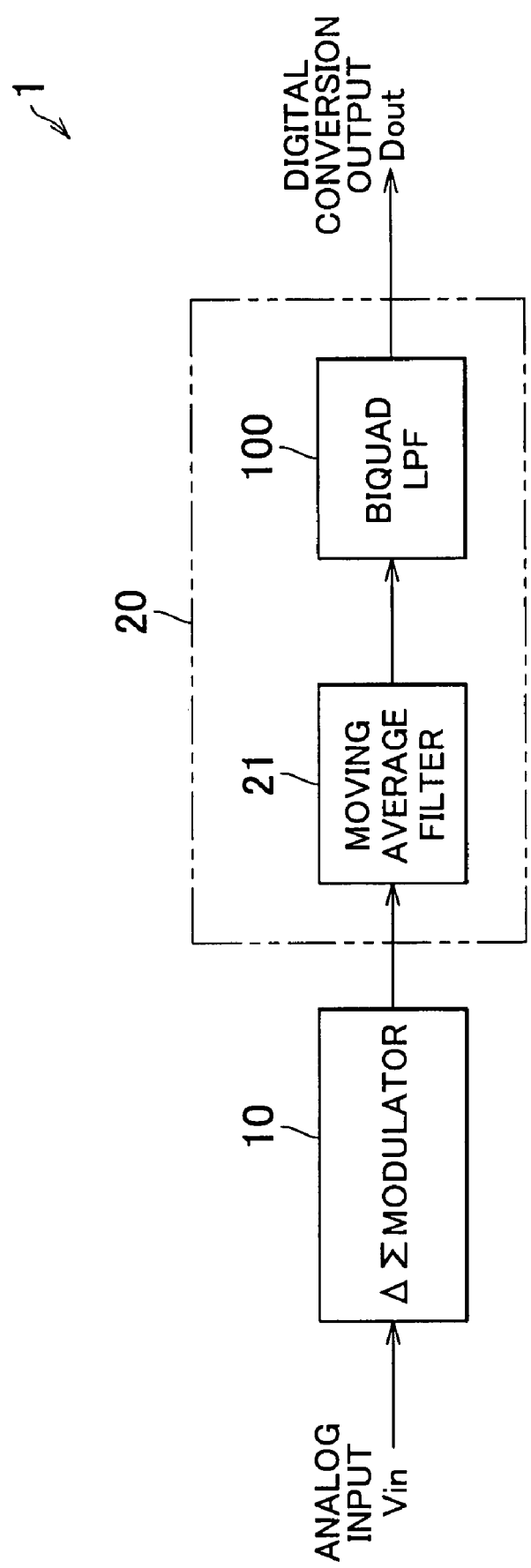
FIG. 5 is a diagram showing an example in which the first embodiment of the digital low-pass filter according to the present invention is used in a ΔΣ A/D converter.

An example in which the digital low-pass filter 100 is used in a ΔΣ A/D converter will be described below with reference to FIG. 5. As shown in FIG. 5, the ΔΣ A/D converter 1 includes a ΔΣ modulator 10 and a decimation filter 20. The ΔΣ modulator 10 outputs a pulse train (digital signal) in which pulse density is proportional to the amplitude of an input signal (analog signal). The digital filter 20 includes a moving average filter 21 and a digital low-pass filter 100. The moving average filter 21 outputs moving averages of the output signal from the ΔΣ modulator 10, and supplies the moving averages to the digital low-pass filter 100.

When the sampling frequency fs (the operation frequency in the case of a digital filter) and the cut-off frequency f$_0$ of the digital low-pass filter 100 are fs=48 kHz and f$_0$=3 kHz, respectively, and it is intended to achieve the second-order Butterworth characteristic (the quality factor Q=(½)$^{0.5}$), the constants k$_1$ and k$_2$ are determined as follows using the expressions 10 and 11, and the expression 9, respectively: k$_1$=0.274; and k$_2$=0.426. Using the first-order approximation of the expression 12 results in k$_1$=0.278, and using the third-order approximation of the expression 12 results in k$_1$=0.274. Using the second-order approximation of the expression 13 results in k$_2$=0.401, and using the third-order approximation of the expression 13 results in k$_2$=0.430.

On the other hand, when the cut-off frequency f$_0$ and the quality factor Q of the digital low-pass filter 100 are calculated on the assumption that the sampling frequency fs (the operation frequency in the case of a digital filter), and the constants k$_1$ and k$_2$ are fs=48 kHz, k$_1$=⅙, and k$_2$=⅛, respectively, k$_1$<<1, and k$_2$<<1 can be assumed, and the cut-off frequency f$_0$ and the quality factor Q are therefore determined as follows using the expression 14 and the expression 15, respectively: f$_0$=0.675 kHz; and Q=(½)$^{0.5}$ (the second-order Butterworth characteristic). When the digital low-pass filter 100 satisfies these conditions, either of the first and second multipliers 112 and 122 is realized using a bit shifter circuit. Thus, it is possible to reduce the amount of calculation in the digital low-pass filter 100. In addition, it is possible to reduce the scale of the circuit, and to reduce the manufacturing costs.

Figure 6:
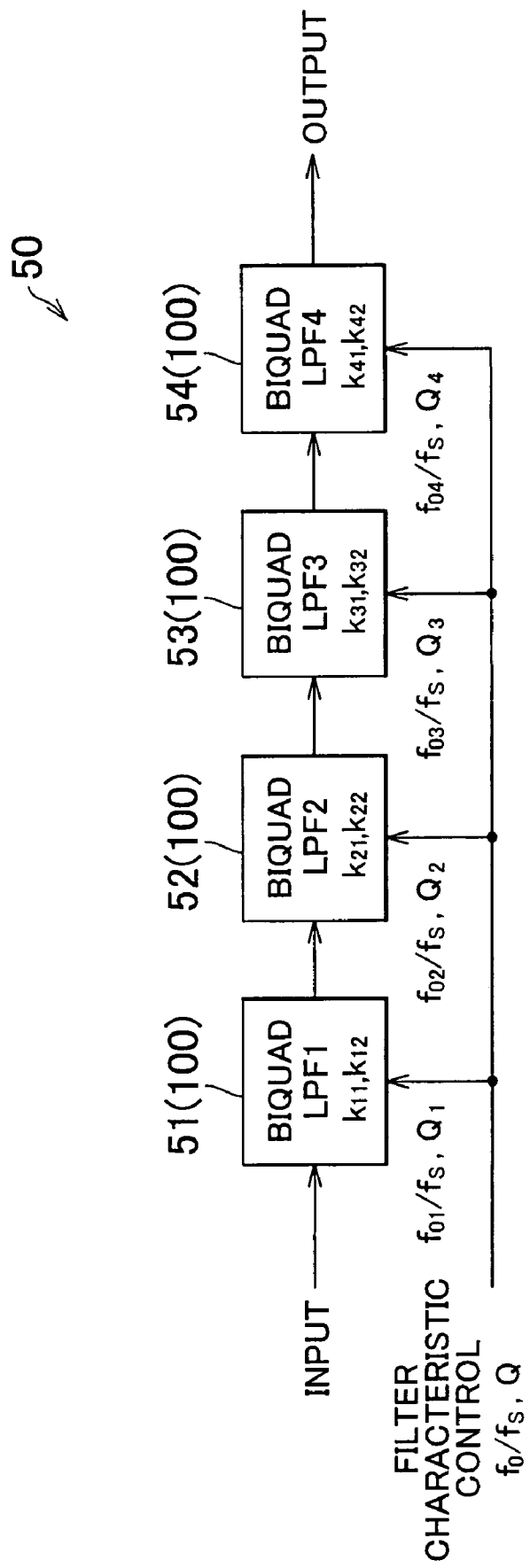
FIG. 6 is a diagram showing an example in which the first embodiment of the digital low-pass filter according to the present invention is used in an eighth order filter.

A method of realizing a higher-order low-pass filter, in which the cut-off frequency is controllable, with the use of digital low-pass filters 100 will be described below with reference to FIG. 6. As shown in FIG. 6, an eighth-order Bessel low-pass filter 50 includes a first-stage biquad low-pass filter 51, a second-stage biquad low-pass filter 52, a third-stage biquad low-pass filter 53, and a fourth-stage biquad low-pass filter 54, which are cascaded to form a four-stage low-pass filter. When the digital low-pass filter 100 is designed so that the constants k$_1$ and k$_2$ are variable, and is used as an arithmetic core, a single digital low-pass filter 100 serves as the first-stage biquad low-pass filter 51, the second-stage biquad low-pass filter 52, the third-stage biquad low-pass filter 53, and the fourth-stage biquad low-pass filter 54.

It is known that, in order to realize an eighth-order Bessel low-pass filter by cascading four biquad low-pass filters, it suffices that the cut-off frequencies of the biquad low-pass filters are set as follows using a cut-off frequency f$_{00}$ of the eighth-order Bessel low-pass filter: the cut-off frequency f$_{01}$ of the first-stage biquad low-pass filter, f$_{01}$=1.784*f$_{00}$; the quality factor Q$_1$ of the first-stage biquad low-pass filter, Q$_1$=0.504; the cut-off frequency f$_{02}$ of the second-stage biquad low-pass filter, f$_{02}$=1.838*f$_{00}$; the quality factor Q$_2$ of the second-stage biquad low-pass filter, Q$_2$=0.560; the cut-off frequency f$_{03}$ of the third-stage biquad low-pass filter, f$_{03}$=1.959*f$_{00}$; the quality factor Q$_3$ of the third-stage biquad low-pass filter, Q$_3$=0.711; the cut-off frequency f$_{04}$ of the fourth-stage biquad low-pass filter, f$_{04}$=2.195*f$_{00}$; and the quality factor Q$_4$ of the fourth-stage biquad low-pass filter, Q$_4$=1.226.

For example, when the cut-off frequency f$_{00}$ and the sampling frequency fs of the eighth-order Bessel low-pass filter 50 are set as follows: f$_{00}$=6 kHz, and fs=192 kHz, by substituting the values of the cut-off frequency and the quality factor of the biquad low-pass filter of each stage in the eighth-order Bessel low-pass filter into the third-order approximation in the expression 12 and the third-order approximation in the expression 13, and using the sampling period T=1/fs, it can be seen that settings may be determined as follows: the constant $k_1$ of the digital low-pass filter 100 serving as the first-stage biquad low-pass filter 51 is $k_1=k_{11}=0.177$; the constant $k_2$ of the digital low-pass filter 100 serving as the first-stage biquad low-pass filter 51, $k_2=k_{12}=0.508$; the constant $k_1$ of the digital low-pass filter 100 serving as the second-stage biquad low-pass filter 52, $k_1=k_{21}=0.200$; the constant $k_2$ of the digital low-pass filter 100 serving as the second-stage biquad low-pass filter 52, $k_2=k_{22}=0.481$; the constant $k_1$ of the digital low-pass filter 100 serving as the third-stage biquad low-pass filter 53, $k_1=k_{31}=0.270$; the constant $k_2$ of the digital low-pass filter 100 serving as the third-stage biquad low-pass filter 53, $k_2=k_{32}=0.421$; the constant $k_1$ of the digital low-pass filter 100 serving as the fourth-stage biquad low-pass filter 54, $k_1=k_{41}=0.520$; and the constant $k_2$ of the digital low-pass filter 100 serving as the fourth-stage biquad low-pass filter 54, $k_2=k_{42}=0.297$.

When operations are performed while varying the constants $k_1$ and $k_2$ of the digital low-pass filter 100 based on the above calculation results as described above, the eighth-order Bessel low-pass filter that uses a single digital low-pass filter 100 as the arithmetic core, and whose cut-off frequency $f_{00}$ and sampling frequency fs are $f_{00}=6$ kHz and fs=192 kHz is realized. In addition, by adjusting the constants $k_1$ and $k_2$ of the digital low-pass filter 100 according to the cut-off frequency $f_{00}$ required of the eighth Bessel low-pass filter, it is possible to variably control the cut-off frequency of the eighth-order Bessel low-pass filter in real time.

Thus, the method of designing a digital low-pass filter according to the present invention is performed through the following steps (1) to (4). (1) The characteristics and the transfer function H(s) of a reference (base) analog low-pass filter are determined. (2) The transfer function H(s) is factorized into a product of that of a first-order (or second-order) filter, and that of a second-order filter to construct a cascaded digital low-pass filter. (3) The cut-off frequency $f_0$ and the quality factor Q are determined based on requirements of a system or the like in which the digital low-pass filter according to the present invention is used. In order to achieve the second-order Butterworth characteristic, Q is set to $(1/2)^{0.5}$. In order to achieve the second Bessel characteristic, Q is set to $(1/3)^{0.5}$. (4) When the conditions, $2\pi*(f_0/fs) \ll 1$ and $2\pi*(f_0/fs)*Q \ll 1$, are satisfied based on the above cut-off frequency $f_0$ and the quality factor Q, the constants $k_1$ and $k_2$ are adjusted using the expressions 12 and 13. When the conditions, $2\pi*(f_0/fs) \ll 1$ and $2\pi*(f_0/fs)*Q \ll 1$, are not satisfied based on the above cut-off frequency $f_0$ and the quality factor Q, the constants $k_1$ and $k_2$ are adjusted using the expressions 9 to 11.

A digital low-pass filter 200, which is a second embodiment of the digital low-pass filter according to the present invention will be described below with reference to FIG. 7.

Figure 7:
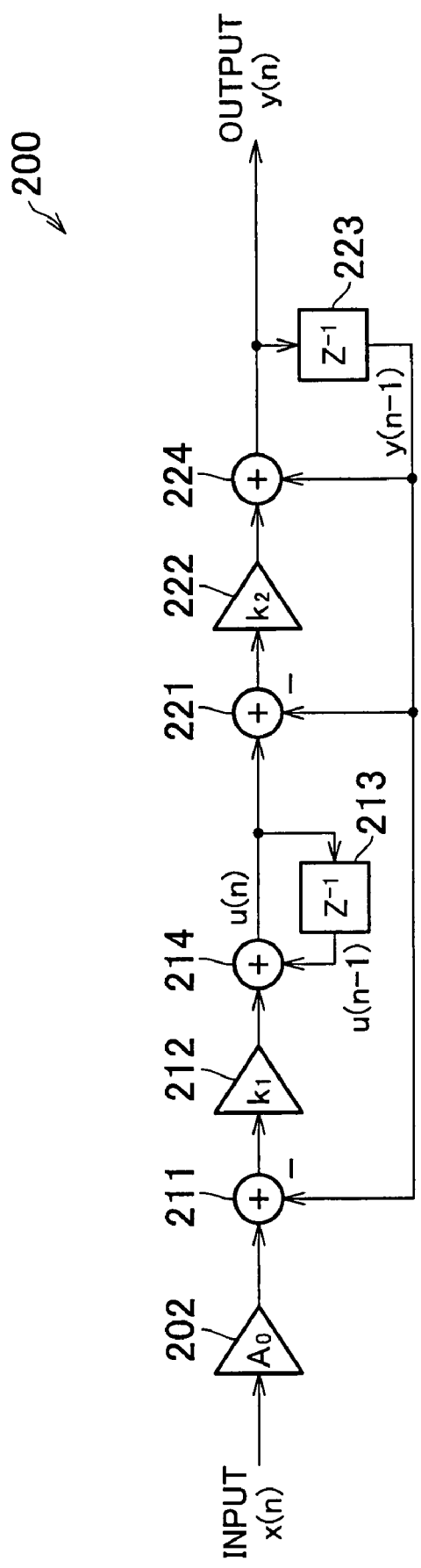
FIG. 7 is a diagram showing a second embodiment of the digital low-pass filter according to the present invention.

As shown in FIG. 7, the digital low-pass filter 200 generally includes a low frequency gain multiplier 202, a first subtracter 211, a first multiplier 212, a first delay unit 213, a first adder 214, a second subtracter 221, a second multiplier 222, a second delay unit 223, and a second adder 224.

The basic configuration of the digital low-pass filter 200 is substantially the same as that of the digital low-pass filter 100 shown in FIG. 1, except that the low frequency gain multiplier 202 is placed at a previous stage relative to the first subtracter 211. It should be noted that, although the low frequency gain multiplier 202 is placed immediately before the first multiplier 211 in this embodiment, the meaning of the "previous stage" is not limited to the "immediately previous" stage, but includes the case where another circuit or the like (an additional delay unit described later, for example) is inserted between the low frequency gain multiplier and the first subtracter.

The low frequency gain multiplier 202 outputs a signal obtained by multiplying the input signal train x(n) by a predetermined low frequency gain $A_0$, and supplies the signal to the first subtracter 211.

An operation flow (scheme) of the digital low-pass filter 200 is represented by the following expression 20 and the above expression 8.

$$u(n)=k_1 \cdot (A_0 \cdot x(n)-y(n-1))+u(n-1) \quad \text{(Expression 20)}$$

When $k_0$ is defined as $k_0=A_0*k_1$, the expression 20 can be transformed into the following expression 21.

$$u(n)=(k_0 \cdot x(n)-k_1 \cdot y(n-1))+u(n-1) \quad \text{(Expression 21)}$$

With such a configuration, the digital low-pass filter 200 brings about substantially the same advantageous effects as those of the digital low-pass filter 100 shown in FIG. 1, and it is possible to select, as the low frequency gain $A_0$, an arbitrary value that is not limited to one. In this embodiment, a configuration is adopted in which the low frequency gain multiplier 202 is placed at a previous stage relative to the first subtracter 211. However, a configuration may be adopted in which the low frequency gain multiplier 202 is placed at a following stage relative to the second adder 224, and in which a signal obtained by multiplying the output signal from the second multiplier 224 by the predetermined low frequency gain $A_0$ is output as the output data (an output signal train y(n)).

A digital low-pass filter 300, which is a third embodiment of the digital low-pass filter according to the present invention will be described below with reference to FIG. 8.

Figure 8:
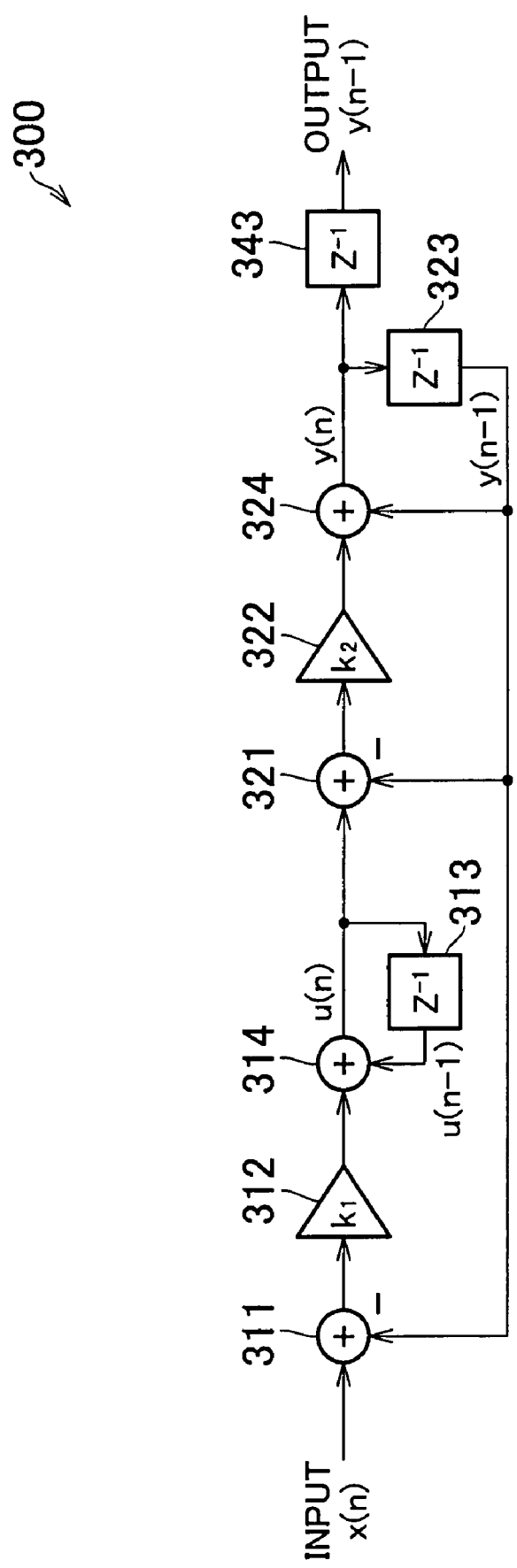
FIG. 8 is a diagram showing a third embodiment of the digital low-pass filter according to the present invention.

As shown in FIG. 8, the digital low-pass filter 300 generally includes a first subtracter 311, a first multiplier 312, a first delay unit 313, a first adder 314, a second subtracter 321, a second multiplier 322, a second delay unit 323, a second adder 324, and an additional delay unit 343.

The basic configuration of the digital low-pass filter 300 is substantially the same as that of the digital low-pass filter 100 shown in FIG. 1, except that the additional delay unit 343 is placed at a following stage relative to the second adder 324. The additional delay unit 343 outputs a signal obtained by delaying an input signal (the output signal from the second adder 324 in the case of this embodiment) by a predetermined sampling time (one sampling period in the case of this embodiment). The digital low-pass filter 300 outputs the output signal from the additional delay unit 343 as the output data (an output signal train y(n)).

With such a configuration, the digital low-pass filter 300 brings about substantially the same advantageous effects as those of the digital low-pass filter 100 shown in FIG. 1, and it is possible to output, as the output data (an output signal train), a signal obtained by delaying input data (an input signal train) by a predetermined sampling time (one sampling period in the case of this embodiment).

In the case of the digital low-pass filter 100 shown in FIG. 1, phase delay in the filter becomes zero at the Nyquist frequency (fs/2). Thus, the phase characteristic of the digital low-pass filter 100 within a high frequency region ($f_0<f<fs/2$) do not match with the phase characteristic of the reference (base) analog filter, which is problematic when it is required to match the phase delay of the digital low-pass filter 100 with that of the reference analog filter. However, the digital low-pass filter 300 outputs, as the output data, a signal train y(n−1) that is delayed by one sampling period by the additional delay unit 343 with respect to an input signal train x(n), so that the delay at the Nyquist frequency becomes T=1/fs (one sampling period), which is 180 degrees in terms of angle (phase delay). Thus, the phase characteristic of the digital low-pass filter 300 well matches with (corresponds with) that of the reference analog filter over entire frequency region. Thus, it becomes possible to easily match the phase of the digital low-pass filter with that of another filter or system.

In this embodiment, a configuration is adopted in which the additional delay unit 343 is placed at a following stage relative to the second adder 324. However, a configuration in which the additional delay unit 343 is placed at a previous stage relative to the first subtracter 311 will also bring about substantially the same advantageous effects. The meanings of the "previous stage" and the "following stage" are not limited to the "immediately previous stage" and the "immediately following stage", but include the case where another circuit or the like (a moving average filter described later, for example) is inserted between the additional delay unit and the first subtracter or the second subtracter.

A digital low-pass filter 400, which is a fourth embodiment of the digital low-pass filter according to the present invention will be described below with reference to FIG. 9.

Figure 9:
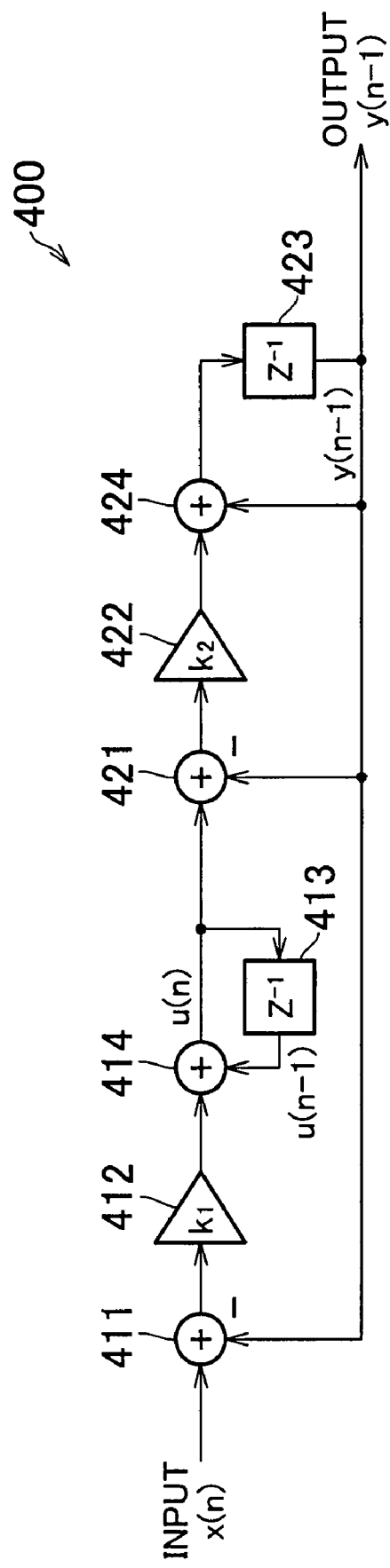
FIG. 9 is a diagram showing a fourth embodiment of the digital low-pass filter according to the present invention.

As shown in FIG. 9, the digital low-pass filter 400 generally includes a first subtracter 411, a first multiplier 412, a first delay unit 413, a first adder 414, a second subtracter 421, a second multiplier 422, a second delay unit 423, and a second adder 424.

The basic configuration of the digital low-pass filter 400 is substantially the same as that of the digital low-pass filter 100 shown in FIG. 1, except that the output signal from the second delay unit 423 is output as the output data (an output signal train) of the digital low-pass filter 400. With such a configuration, the second delay unit 423 is also used as (functions as) the additional delay unit 343 in the digital low-pass filter 300 shown in FIG. 8. Thus, the digital low-pass filter 400 brings about substantially the same advantageous effects as those of the digital low-pass filter 300 shown in FIG. 8, without providing an additional delay unit at a following stage relative to the second adder 424.

A digital low-pass filter 500, which is a fifth embodiment of the digital low-pass filter according to the present invention will be described below with reference to FIG. 10.

Figure 10:
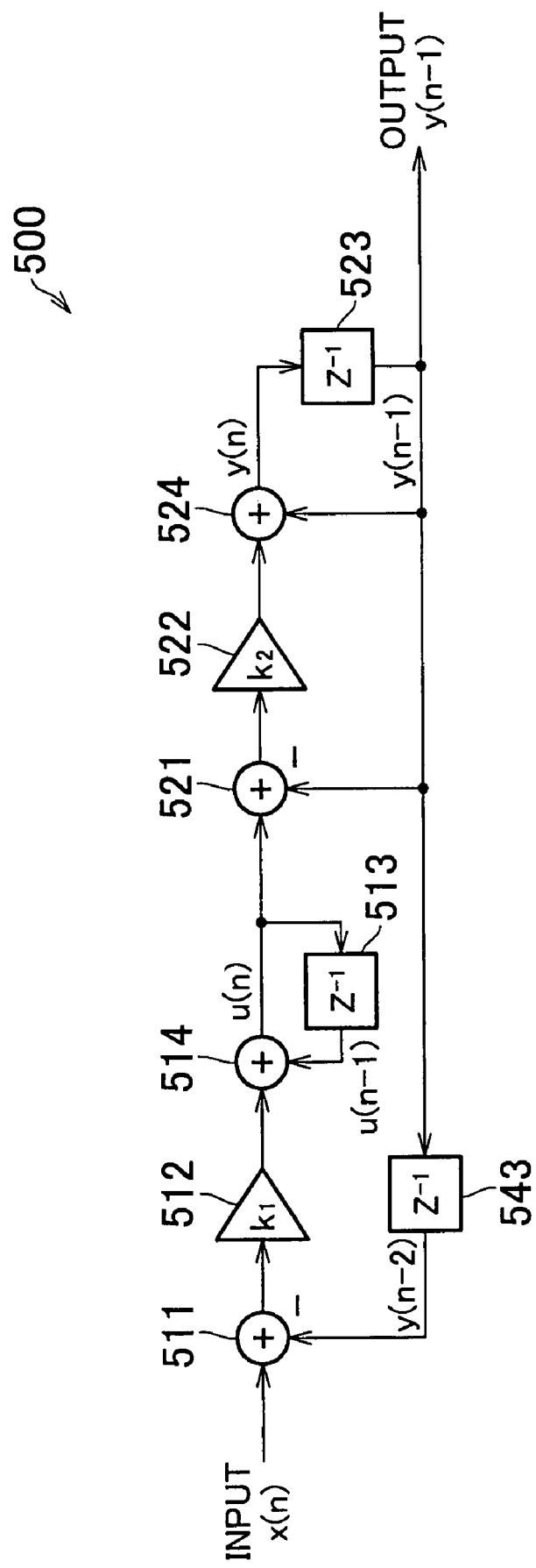
FIG. 10 is a diagram showing a fifth embodiment of the digital low-pass filter according to the present invention.

As shown in FIG. 10, the digital low-pass filter 500 generally includes a first subtracter 511, a first multiplier 512, a first delay unit 513, a first adder 514, a second subtracter 521, a second multiplier 522, a second delay unit 523, a second adder 524, and an additional delay-unit 543.

The basic configuration of the digital low-pass filter 500 is substantially the same as that of the digital low-pass filter 100 shown in FIG. 1, except that the digital low-pass filter 500 includes the additional delay unit 543, and outputs, as the output data (an output signal train) of the digital low-pass filter 500, the output signal from the second delay unit 523. The additional delay unit 543 outputs a signal obtained by delaying the output signal (the first feedback term) from the second delay unit 523 by a predetermined sampling time (one sampling period in the case of this embodiment), and supplies the signal to the first subtracter 511.

Thus, substantially the same advantageous effects as those of the digital low-pass filter 100 shown in FIG. 1 are brought about by a configuration (see the digital low-pass filter 300 shown in FIG. 8) in which a delay unit (additional delay unit) is placed at a previous stage or a following stage, or at each of the previous stage and the following stage, relative to the digital low-pass filter according to the present invention as appropriate, and a configuration (see the digital low-pass filter 500 shown in FIG. 10) in which a delay unit (additional delay unit) is inserted in the digital low-pass filter as appropriate. Especially when the constants $k_1$ and $k_2$ are sufficiently smaller than one ($k_1 \ll 1$, $k_2 \ll 1$), addition of a delay unit (additional delay unit), although causing a slight shift of timing and phase, does not cause a significant change in the amplitude characteristic of the filter.

A digital low-pass filter 600, which is a sixth embodiment of the digital low-pass filter according to the present invention will be described below with reference to FIG. 11.

Figure 11:
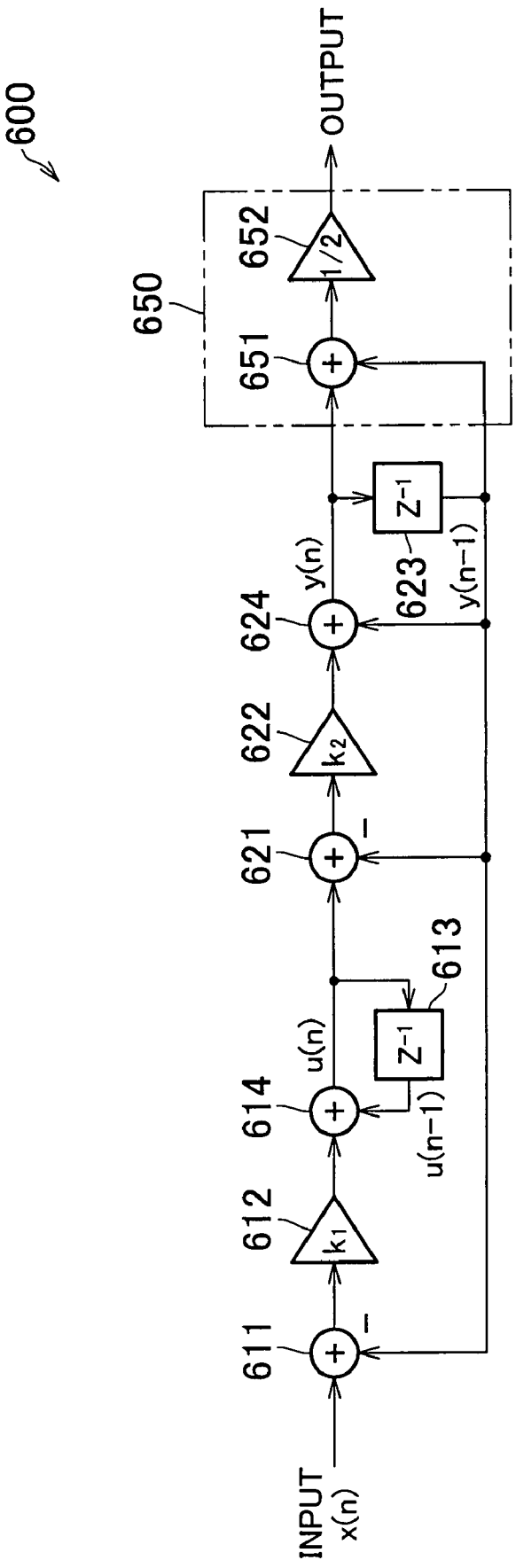
FIG. 11 is a diagram showing a sixth embodiment of the digital low-pass filter according to the present invention.

As shown in FIG. 11, the digital low-pass filter 600 generally includes a first subtracter 611, a first multiplier 612, a first delay unit 613, a first adder 614, a second subtracter 621, a second multiplier 622, a second delay unit 623, a second adder 624, and a moving average filter 650.

The basic configuration of the digital low-pass filter 600 is substantially the same as that of the digital low-pass filter 100 shown in FIG. 1, except that the digital low-pass filter 600 includes the moving average filter 650.

The moving average filter 650, placed at a following stage relative to the second adder 624, outputs the moving average of an input signal (the output signal from the second adder 624 in the case of this embodiment). The moving average filter 650 includes an adder 651 and a multiplier 652.

The adder 651 outputs a signal obtained by adding the output signal from the second delay unit 623 to the output signal from the second adder 624. The multiplier 652 outputs a signal obtained by multiplying the output signal from the adder 651 by ½. Because the filter coefficient of the multiplier 652 is ½, it is possible to realize the multiplier 652 with the use of a one-bit shifter circuit or the like that has a small circuit size.

The output signal from the second delay unit 623 is obtained by delaying the output signal from the second adder 624 by one sampling period. Thus, the output signal from the moving average filter 650 (the output signal from the multiplier 652) is the average of the output signal from the second adder 624 and the signal obtained by delaying the output signal from the second adder 624 by one sampling period, that is, the moving average of the output signal from the second adder 624.

When the digital low-pass filter 600 is configured as described above, the following advantageous effects are brought about. Specifically, regarding a frequency characteristic, when the curve of the amplitude characteristic of the reference analog filter does not sufficiently fall at frequencies satisfying f≧fs/2 (fs: sampling frequency, or, in the case of a digital filter, operation frequency), there is a problem that an aliasing effect occurs near the frequency f=fs/2 in the case of the digital low-pass filter 100 shown in FIG. 1. However, when the moving average filter 650 is placed at a following stage relative to the second adder 624 as shown in the digital low-pass filter 600 of this embodiment, a zero point is formed at the frequency f=fs/2, so that it is possible to reduce such an aliasing effect near the frequency f=fs/2. Because the digital low-pass filter 600 of this embodiment originally includes the second delay unit 623 that outputs a signal obtained by delaying the output signal from the second adder 624 by one sampling period, using the output signal from the second delay unit 623 eliminates the necessity to provide the moving average filter 650 with an additional delay unit, and it is therefore possible to simplify the moving average filter 650.

A digital low-pass filter 700, which is a seventh embodiment of the digital low-pass filter according to the present invention will be described below with reference to FIG. 12.

Figure 12:
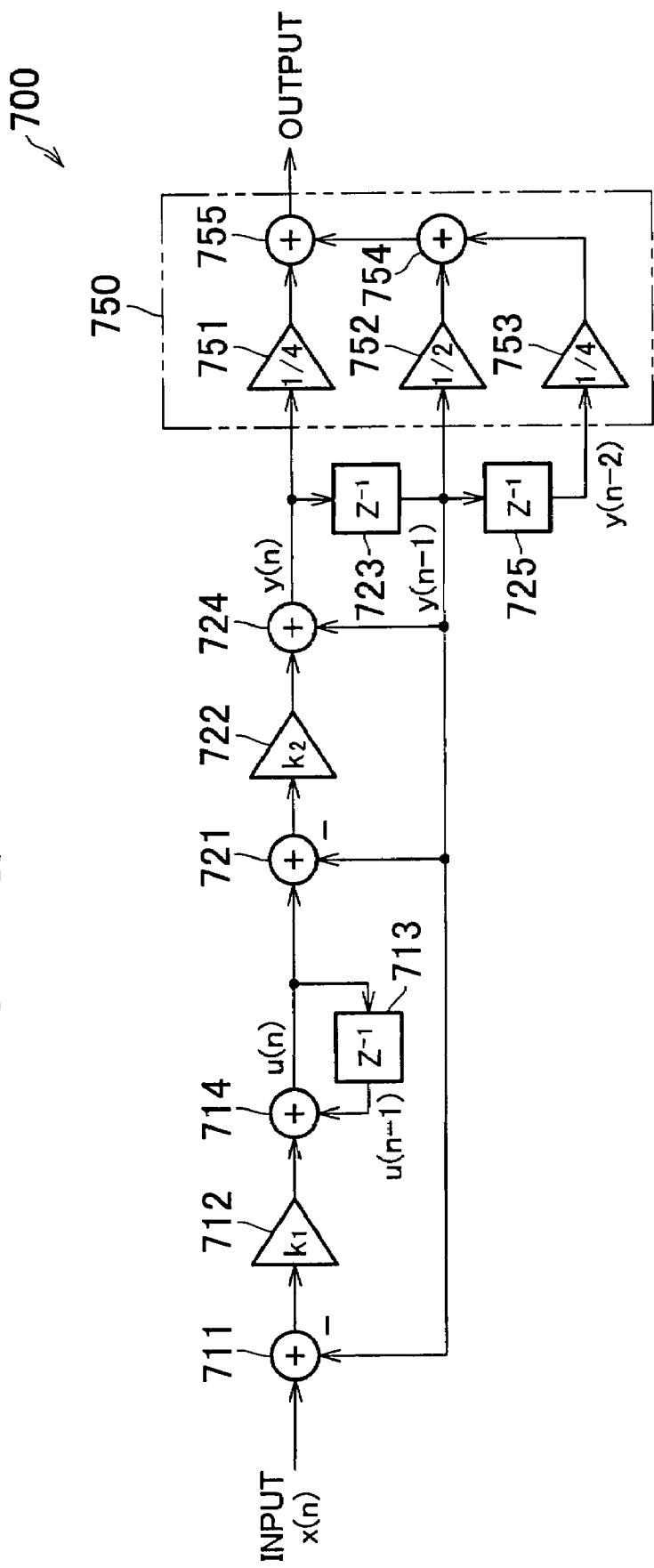
FIG. 12 is a diagram showing a seventh embodiment of the digital low-pass filter according to the present invention.

As shown in FIG. 12, the digital low-pass filter 700 generally includes a first subtracter 711, a first multiplier 712, a first delay unit 713, a first adder 714, a second subtracter 721, a second multiplier 722, a second delay unit 723, a second adder 724, an additional delay unit 725, and a moving average filter 750.

The basic configuration of the digital low-pass filter 700 is substantially the same as that of the digital low-pass filter 100 shown in FIG. 1, except that the digital low-pass filter 700 includes the additional delay unit 725 and the moving average filter 750.

The additional delay unit 725 outputs a signal obtained by delaying the output signal from the second delay unit 723 by one sampling period.

The moving average filter 750 is placed at a following stage relative to the second adder 724, and outputs the moving average of an input signal (the output signal from the second adder 724 in the case of this embodiment). The moving average filter 750 includes multipliers 751, 752, and 753, and adders 754, and 755.

The multiplier 751 outputs a signal obtained by multiplying the output signal from the second adder 724 by ¼. Because the filter coefficient of the multiplier 751 is ¼, it is possible to realize the multiplier 751 with the use of a two-bit shifter circuit or the like that has a small circuit size.

The multiplier 752 outputs a signal obtained by multiplying the output signal from the second delay unit 723 by ½. Because the filter coefficient of the multiplier 752 is ½, it is possible to realize the multiplier 752 with the use of a one-bit shifter circuit or the like that has a small circuit size.

The multiplier 753 outputs a signal obtained by multiplying the output signal from the additional delay unit 725 by ¼. Because the filter coefficient of the multiplier 753 is ¼, it is possible to realize the multiplier 752 with the use of a two-bit shifter circuit or the like that has a small circuit size.

The adder 754 outputs a signal obtained by adding the output signal from the multiplier 753 to the output signal from the multiplier 752.

The adder 755 outputs a signal obtained by adding the output signal from the adder 754 to the output signal from the multiplier 751.

The output signal from the moving average filter 750 (the output signal from the adders 755) is the sum of the signal obtained by multiplying the output signal from the second adder 724 by ¼, the signal obtained by multiplying, by ½, the signal that is obtained by delaying the output signal from the second adder 724 by one sampling period, and the signal obtained by multiplying, by ¼, the signal that is obtained by delaying the output signal from the second adder 724 by two sampling periods. In other words, the output signal from the moving average filter 750 is the moving average of the output signal from the second adder 724.

When the digital low-pass filter 700 is configured as described above, advantageous effects similar to those of the digital low-pass filter 600 shown in FIG. 11 are brought about. In the digital low-pass filter 700, the effect of reducing the aliasing effect that occurs near the frequency f=fs/2 is more significant than that of the digital low-pass filter 600. In addition, in the case of the digital low-pass filter 700, the output signal from the moving average filter 750 is delayed by one sampling period as a whole, and therefore, the phase characteristic matches with that of a reference analog filter over a wide range as in the case of the digital low-pass filter 300 shown in FIG. 8 and the digital low-pass filter 400 shown in FIG. 9.

The "moving average" includes, but is not limited to, the simple moving average in which each output signal to be added is not weighted, as in the moving average filter 650 shown in FIG. 11, and the weighted moving average in which each output signal to be added is weighted, as in the moving average filter 750 shown in FIG. 12.

Although the moving average filter 650 in the digital low-pass filter 600 and the moving average filter 750 in the digital low-pass filter 700 include a multiplier(s) (the one-bit shifter circuit or the two-bit shifter circuit, in the case of these embodiments), the multiplier(s) may be omitted. In this case, the output signal (output data) from the digital low-pass filter merely becomes twice the moving average.

A digital low-pass filter 800, which is an eighth embodiment of the digital low-pass filter according to the present invention will be described below with reference to FIG. 13.

Figure 13:
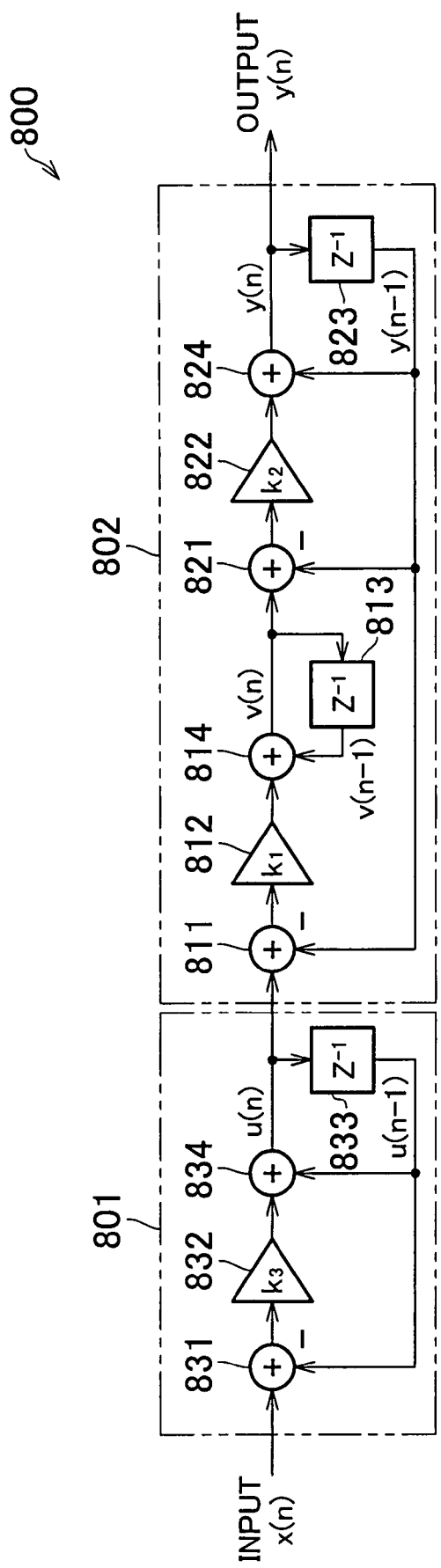
FIG. 13 is a diagram showing a eighth embodiment of the digital low-pass filter according to the present invention.

As shown in FIG. 13, the digital low-pass filter 800 generally includes a first order filter 801 and a second order filter 802, and forms a so-called cascaded filter. The first order filter 801 includes a third subtracter 831, a third multiplier 832, a third delay unit 833, and a third adder 834. The second order filter 802 includes a first subtracter 811, a first multiplier 812, a first delay unit 813, a first adder 814, a second subtracter 821, a second multiplier 822, a second delay unit 823, and a second adder 824.

In the digital low-pass filter 800, the first order filter 801 is placed at a previous stage relative to the second order filter 802 (more specifically, the previous stage relative to the first subtracter 811). The configuration of the second order filter 802 is substantially the same as that of the digital low-pass filter 100 shown in FIG. 1. Thus, the digital low-pass filter 800 brings about substantially the same advantageous effects as those of the digital low-pass filter 100 shown in FIG. 1 by virtue of the second order filter 802.

The third subtracter 831 outputs a signal obtained by subtracting a second feedback term from the input signal. In this embodiment, the input signal supplied to the third subtracter 831 is input data in the form of a digital signal train (an input signal train x(n)). The second feedback term will be described later.

The third multiplier 832 outputs a signal obtained by multiplying the output signal from the third subtracter 831 (the signal obtained by subtracting the second feedback term from the input data in the form of a digital signal train) by a constant $k_3$.

The third delay unit 833 outputs, as the second feedback term, a signal obtained by delaying an input signal by a predetermined sampling time. In the case of this embodiment, the input signal supplied to the third delay unit 833 is the output signal from the third adder 834 described later. In general, the length of the "predetermined sampling time" is one sampling period of a digital circuit or the like in which the digital low-pass filter is used. However, this length may be appropriately selected according to applications or the like of the digital low-pass filter.

The third adder 834 outputs a signal obtained by adding the output signal from the third multiplier 832 (that is, the signal obtained by multiplying the output signal from the third subtracter 831 by the constant $k_3$) to the output signal from the third delay unit 833 (that is, the signal obtained by delaying the input signal supplied to the third delay unit 833 by a predetermined sampling time), and supplies the signal to the third delay unit 833. The output signal from the third adder 834 is not only the input signal supplied to the third delay unit 833, but also the input signal supplied to the first subtracter 811.

The ratio among the constants $k_1$, $k_2$, and $k_3$ in the digital low-pass filter 800 is set to 1:1:1 ($k_1=k_2=k_3(=k_0)$). In the case of $k_0<<1$, the cut-off frequency $f_{01}$ of the first order filter 801, the cut-off frequency $f_{02}$ of the second order filter (biquad filter) 802, and the quality factor $Q_2$ of the second order filter (biquad filter) 802 are $f_{o1}=k_0 \cdot fs/(2\pi)$, $f_{o2}=k_0 \cdot fs/(2\pi)$, and $Q_2=1$, respectively.

Thus, such a digital low-pass filter 800 into which the first order filter 801 and the second order filter 802 are combined achieves the third-order Butterworth characteristic, in which the cut-off frequency $f_0=k_0 \cdot fs/(2\pi)$. In the digital low-pass filter 800, because the ratio among the constants $k_1$, $k_2$, and $k_3$ is set to 1:1:1, three multipliers (the first to third multipliers 812, 822, and 832) may be the same circuit (or the circuit of the same type), and a single multiplication coefficient memory suffices.

A digital low-pass filter 900, which is a ninth embodiment of the digital low-pass filter according to the present invention will be described below with reference to FIG. 14.

Figure 14:
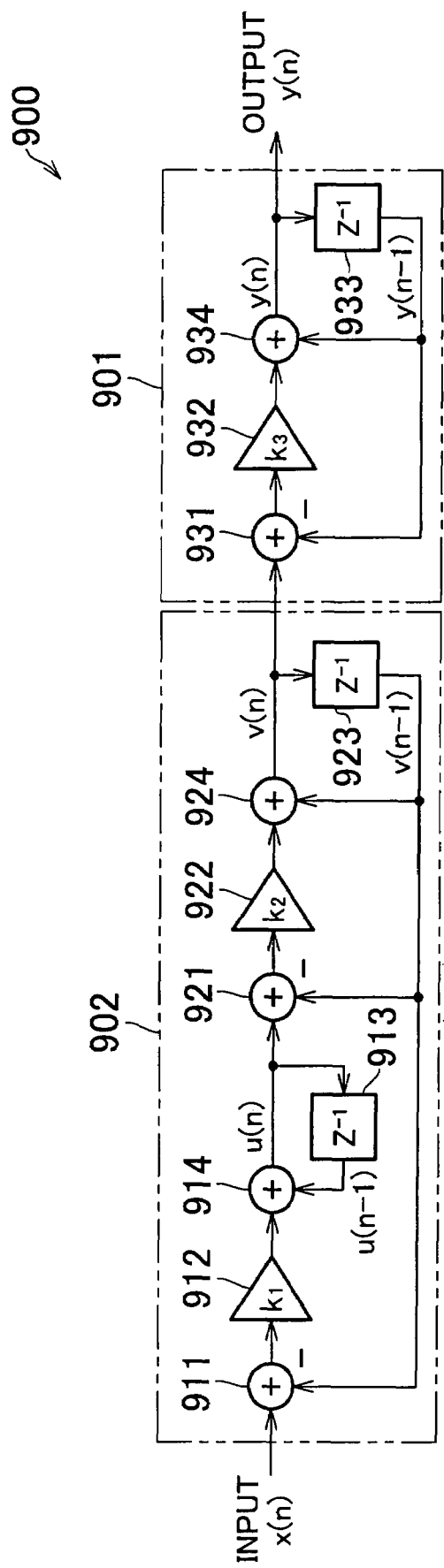
FIG. 14 is a diagram showing a ninth embodiment of the digital low-pass filter according to the present invention.
Figure 15:
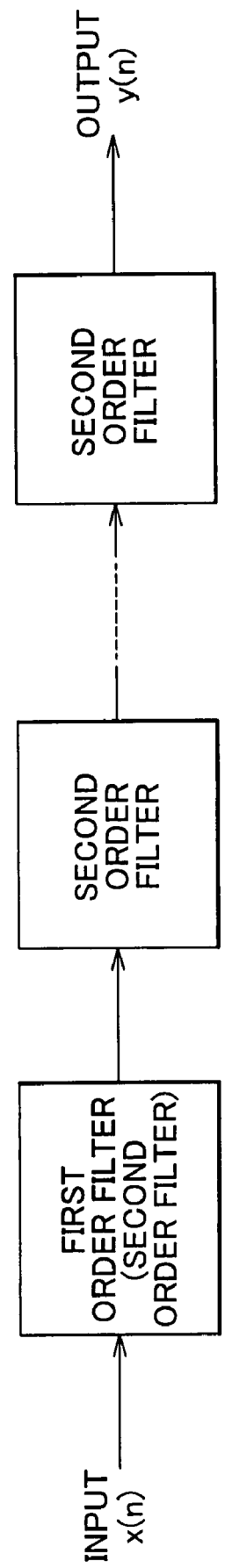
FIG. 15 is a diagram showing a configuration of a cascaded low-pass filter.

As shown in FIG. 14, the digital low-pass filter 900 generally includes a first order filter 901 and a second order filter 902, and forms a so-called cascaded filter. The first order filter 901 includes a third subtracter 931, a third multiplier 932, a third delay unit 933, and a third adder 934. The second order filter 902 includes a first subtracter 911, a first multiplier 912, a first delay unit 913, a first adder 914, a second subtracter 921, a second multiplier 922, a second delay unit 923, and a second adder 924.

In the digital low-pass filter 900, the first order filter 901 is placed at a following stage relative to the second order filter 902 (more specifically, the following stage relative to the second adder 924). The configuration of the second order filter 902 is substantially the same as that of the digital low-pass filter 100 shown in FIG. 1. Thus, the digital low-pass filter 900 brings about substantially the same advantageous effects as those of the digital low-pass filter 100 shown in FIG. 1 by virtue of the second order filter 902.

The basic configuration of the digital low-pass filter 900 is such that the positions of the first order filter and the second order filter are inverted as compared to those of the digital low pass filter 800 shown in FIG. 13. Thus, the digital low-pass filter 900 brings about substantially the same advantageous effects as those of the digital low pass filter 800 shown in FIG. 13. In the digital low pass filter 800 shown in FIG. 13, high frequency components of the input data are reduced by the first order filter in advance, and the overshoot thereafter (in the second order filter) is restricted. Thus, it is easy to prevent occurrence of an arithmetic overflow as compared to the case of the digital low-pass filter 900 shown in FIG. 14.

While the invention has been described with reference to example embodiments thereof, it is to be understood that the invention is not limited to the described embodiments or constructions. To the contrary, the invention is intended to cover various modifications and equivalent arrangements. In addition, while the various elements of the example embodiments are shown in various combinations and configurations, other combinations and configurations, including more, less or only a single element, are also within the spirit and scope of the invention.

What is claimed is:

1. A digital low-pass filter comprising:
   a first subtracter that outputs a signal obtained by subtracting a first feedback term from an input signal;
   a first multiplier that outputs a signal obtained by multiplying the output signal from the first subtracter by a constant $k_1$;
   a first delay unit that outputs a signal obtained by delaying an input signal by a predetermined sampling time;
   a first adder that outputs a signal obtained by adding the output signal from the first multiplier to the output signal from the first delay unit, wherein the output signal from the first adder is supplied to the first delay unit;
   a second subtracter that outputs a signal obtained by subtracting the first feedback term from the output signal from the first adder;
   a second multiplier that outputs a signal obtained by multiplying the output signal from the second subtracter by a constant $k_2$;
   a second delay unit that outputs, as the first feedback term, a signal obtained by delaying an input signal by a predetermined sampling time; and
   a second adder that outputs a signal obtained by adding the output signal from the second multiplier to the output signal from the second delay unit, wherein the output signal from the second adder is supplied to the second delay unit.

2. The digital low-pass filter according to claim 1, wherein the constant $k_1$ is set according to one of the following expressions 1 and 2 with the use of a desired sampling period T, a desired quality factor Q, and a desired cut-off frequency $f_0$, and
   the constant $k_2$ is set according to one of the following expressions 3 and 4 with the use of the desired sampling period T, the desired quality factor Q, and the desired cut-off frequency $f_0$:

$$k_1 = 2\pi f_0 TQ; \quad \text{(Expression 1)}$$

$$k_1 = 2\pi f_0 TQ\{1 - A \cdot (2\pi f_0 T)^2\} (0 \leq A \leq 1); \quad \text{(Expression 2)}$$

$$k_2 = 2f_0 T/Q; \text{ and} \quad \text{(Expression 3)}$$

$$k_2 = (2\pi f_0 T/Q)\{1 - (\tfrac{1}{2})(2\pi f_0 T/Q) + B \cdot (2\pi f_0 T/Q)^2\}$$
$$(0 \leq B \leq 1). \quad \text{(Expression 4)}$$

3. The digital low-pass filter according to claim 1, further comprising:
   an additional delay unit, placed at least one of a previous stage relative to the first subtracter and a following stage relative to the second adder, that outputs a signal obtained by delaying an input signal by a predetermined sampling time.

4. The digital low-pass filter according to claim 1, further comprising:
   a moving average filter, placed at a following stage relative to the second adder, that outputs a moving average of an input signal.

5. The digital low-pass filter according to claim 1, wherein a ratio between the constants $k_1$ and $k_2$ is set to 1:2.

6. The digital low-pass filter according to claim 1, wherein a ratio between the constants $k_1$ and $k_2$ is set to 1:3.

7. The digital low-pass filter according to claim 1, further comprising:
   a third subtracter that outputs a signal obtained by subtracting a second feedback term from an input signal;
   a third multiplier that outputs a signal obtained by multiplying the output signal from the third subtracter by a constant $k_3$;
   a third delay unit that outputs, as the second feedback term, a signal obtained by delaying an input signal by a predetermined sampling time; and
   a third adder that outputs a signal obtained by adding the output signal from the third multiplier to the output signal from the third delay unit, wherein the output signal from the third adder is supplied to the third delay unit,
   wherein the third subtracter, the third multiplier, the third delay unit, and the third adder are placed at least one of a previous stage relative to the first subtracter, and a following stage relative to the second adder, and a ratio between the constants $k_1$, $k_2$, and $k_3$ is set to 1:1:1.

8. The digital low-pass filter according to claim 1, wherein the constants $k_1$ and $k_2$ are variable.

9. The digital low-pass filter according to claim 8, wherein the constants $k_1$ and $k_2$ are varied substantially proportionally to the cut-off frequency $f_0$.

10. The digital low-pass filter according to claim 1, wherein the constant $k_1$ is fixed, and the constant $k_2$ is variable.

11. The digital low-pass filter according to claim 1, wherein an operation data length in the second multiplier is set smaller than an operation data length in the first multiplier.

* * * * *